US006562650B2

(12) United States Patent
Ladabaum

(10) Patent No.: US 6,562,650 B2
(45) Date of Patent: May 13, 2003

(54) MICROFABRICATED TRANSDUCERS FORMED OVER OTHER CIRCUIT COMPONENTS ON AN INTEGRATED CIRCUIT CHIP AND METHODS FOR MAKING THE SAME

(75) Inventor: Igal Ladabaum, San Carlos, CA (US)

(73) Assignee: Sensant Corporation, San Leandro, CA (US)

( * ) Notice: Subject to any disclaimer, the term of this patent is extended or adjusted under 35 U.S.C. 154(b) by 90 days.

(21) Appl. No.: 09/823,412

(22) Filed: Mar. 29, 2001

(65) Prior Publication Data

US 2003/0032211 A1 Feb. 13, 2003

Related U.S. Application Data

(62) Division of application No. 09/344,312, filed on Jun. 24, 1999, now Pat. No. 6,246,158.

(51) Int. Cl.[7] ........................ H01L 21/00; H01L 41/04; H01L 41/08; H01L 41/18

(52) U.S. Cl. ........................... 438/53; 438/50; 310/334

(58) Field of Search ..................... 438/50, 53; 310/334; 367/174, 155, 180, 181; 257/415

(56) References Cited

U.S. PATENT DOCUMENTS 5,329,498 A 7/1994 Greenstein .............. 310/334 X
5,406,163 A 4/1995 Carson et al. .......... 310/334 X
5,692,279 A 12/1997 Mang et al. ............ 310/334 X
5,789,845 A 8/1998 Wadaka et al. ............. 310/334
6,346,811 B1 * 2/2002 Smith, Jr. .................... 324/252
6,324,907 B1 * 12/2002 Halteren et al. .............. 73/431

FOREIGN PATENT DOCUMENTS

WO WO/9819140 5/1998 ........... G01H/11/06

* cited by examiner

*Primary Examiner*—John F. Niebling
*Assistant Examiner*—Viktor Simkovic
(74) *Attorney, Agent, or Firm*—Pillsbury Winthrop LLP

(57) ABSTRACT

The present invention provides an acoustic transducer, or an array of such transducers, formed on a single integrated circuit chip, and a method of making the same, in which there is included an array of acoustic transducers, each capable of detecting an acoustic signal and generating a transducer signal, and including a first and second electrode with a void region disposed between the first and second electrode, and at least one signal line associated with one of the first and second electrodes. Disposed below the array of acoustic transducers is a plurality of amplifiers and other circuit components, such that each of the plurality of amplifiers is coupled to one of the signal lines associated with one of the acoustic transducers and is capable of amplifying the associated transducer signal to obtain an amplified transducer signal on an amplifier output signal line.

14 Claims, 31 Drawing Sheets

MICROFABRICATED TRANSDUCERS FORMED OVER OTHER CIRCUIT COMPONENTS ON AN INTEGRATED CIRCUIT CHIP AND METHODS FOR MAKING THE SAME

CROSS-REFERENCE TO RELATED APPLICATION

This application is a division of U.S. application Ser. No. 09/344,312 filed Jun. 24, 1999 now U.S. Pat. No. 6,246,158.

BACKGROUND OF THE INVENTION

I. Field of the Invention

The present invention relates to the field of acoustic transducers. More specifically, the present invention relates to microfabricated transducers formed on the same chip as other integrated circuit components and a method for making the same.

II. Description of the Related Art

An acoustic transducer is an electronic device used to emit and receive sound waves. Acoustic transducers that operate at frequencies beyond the range of human hearing are used in medical imaging, non-destructive evaluation, and other applications. The most common forms of acoustic transducers that operate in the ultrasonic frequency range are piezoelectric transducers.

In a typical ultrasonic medical imaging system, an acoustic transducer is used along with other components, such as amplifiers, analog to digital converters, digital to analog converters, switches, analog multiplexors, digital multiplexors, microprocessors or microcontrollers. Different types of transducers, such as capacitive microfabricated transducers, can be used in systems that usually use piezoelectric components. In these systems, the transducers used are connected to certain other components via cables that electrically connect the transducer to the appropriate components.

Microfabricated transducers that are used in systems such as mentioned above will include, as illustrated in FIG. 1A, a conventional microfabricated transducer 10 that contains a void region 12 covered by a membrane 14. Disposed on top of the membrane 14 is one electrode 16 of a capacitor, and disposed below the void region 12 is another electrode 18 of a capacitor.

In operation, such a transducer can be used to generate an acoustic signal or detect an acoustic signal. By generating electrical signals on the electrodes of the transducer, an electrostatic attraction between the electrodes 16 and 18 is caused. This attraction causes oscillation of the membrane 14, which, by thus moving, generates the acoustic signal. Similarly, an incoming acoustic signal will cause the membrane 14 to oscillate. This oscillation causes the distance between the two electrodes 16 and 18 to change, and there will be an associated change in the capacitance between the two electrodes 16 and 18. The motion of the membrane 14 and, therefore, the incoming acoustic signal can thus be detected.

Improvements in the sensitivity of microfabricated acoustic transducers have been proposed. One example is the acoustic transducer disclosed in U.S. patent application Ser. No. 09/315,896 filed May 20, 1999, entitled "Acoustic Transducer And Method Of Making The Same."

Arrays of acoustic transducers, whether integrated or not, are also known. In a typical acoustic transducer array, independent acoustic transducers are capable of being excited and interrogated at different phases. While having an array of acoustic transducers enables the imaging functionality, each independent acoustic transducer in the array must have distinct signal lines so that the signal that is to be generated and/or detected can be independently controlled. As the number of independent acoustic transducers in an array becomes large, the number of additional signal lines necessary to control the different acoustic transducers becomes very large, which can limit the ultimate size of the array. In the context of microfabricated acoustic transducer devices, since the number of available paths able to establish an appropriate electrical contact with the electrical circuit is limited, large arrays of microfabricated acoustic transducers have heretofore been unavailable.

Also heretofore unavailable have been single elements and arrays of acoustic transducers formed with other specific integrated circuits. PCT Application No. WO/98/19140, however, proposes placing a transducer on the same integrated circuit chip with other electronic components. FIG. 1B, taken from FIG. 1 of this PCT application, illustrates that the transducer is formed integrally with the other electronic components 13. Thus, for instance, the electrodes to which the terminal contacts 4,6 connect are formed on opposite sides of the cavity 8, integrally with portions of the other electronic components 13. Thus, for example, the lower electrode of the transducer is formed within the same substrate region as other adjacent electronic components 13. This approach to forming a transducer with other specific integrated circuits, however, requires that the resulting integrated circuit provide certain areas for the transducer, and other adjacent areas for the electronic components 13, which results in an integrated circuit that is extremely complex in its layout. Furthermore, in order to obtain a transducer in a reasonable number of fabrication steps, compromises to the design must be made, or the number of process steps needed will result in an extremely costly process. Accordingly, this approach has drawbacks and this approach does not appear to be in widespread use.

Thus, it can be appreciated that while microfabricated transducers have many advantages, there are still many impediments to their widespread use. In addition to the difficulties noted above, it has been further recognized by the present inventor that making microfabricated transducers on their own separate substrate subjects the system to additional limitations. In particular, when the microfabricated transducer chip is connected to electronic circuitry, the electrical load (both real and imaginary) of such electrical connections and discrete electronics can negatively impact the performance of the transducer.

What is needed therefore, is a microfabricated transducer that can be formed, singly, in linear arrays, or in 2 dimensional matrices, over other integrated circuit components on the same chip, and a method for making the same

SUMMARY OF THE INVENTION

It is an object of the present invention to provide an acoustic transducer or an array of such transducers formed over other circuit components on the same integrated circuit.

It is an object of the present invention to provide an acoustic transducer or an array of such transducers formed over an amplifier or an array of amplifiers on the same integrated circuit.

It is an object of the present invention to provide an acoustic transducer or an array of such transducers formed over analog-to-digital and digital-to-analog converters, or an array of such converters, on the same integrated circuit.

It is an object of the present invention to provide an acoustic transducer array formed over a multiplexor on the same integrated circuit.

It is a further object of the present invention to provide a method of fabricating an acoustic transducer and arrays of such transducers over other circuit components on the same integrated circuit.

It is a further object of the present invention to provide a method of fabricating an acoustic transducer array over a multiplexor on the same integrated circuit.

The present invention achieves the above objects, among others, by providing a transducer array formed on a single integrated circuit chip in which there is included an array of acoustic transducers, each capable of detecting an acoustic signal and generating a transducer signal, and including a first and second electrode with a void region disposed between the first and second electrode, and at least one signal line associated with one of the first and second electrodes. Disposed below the array of acoustic transducers is a plurality of amplifiers and other circuit components, such that each of the plurality of amplifiers is coupled to one of the signal lines associated with one of the acoustic transducers and is capable of amplifying the associated transducer signal to obtain an amplified transducer signal on an amplifier output signal line.

The present invention also provides a method of making an integrated circuit chip having an array of transducers disposed over other circuit components. The method initially includes the step of forming the other circuit components on a semiconductor substrate using a fabrication process. The fabrication process uses materials that may cause malfunction if subjected to temperatures over a predetermined maximum temperature for a period of time, and the step of forming includes forming interconnect points to which transducer interconnect lines can be subsequently connected. Thereafter, an array of transducers is formed over the other circuit components. The step of forming the array of transducers uses another fabrication process that will prevent the previously formed other circuit components from being subjected to temperatures over the predetermined maximum temperature for the period of time. The step of forming the array of transducers includes forming transducer interconnect lines that couple at least one electrode associated with each transducer to the interconnect points.

BRIEF DESCRIPTION OF THE DRAWINGS

The features, objects and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1A:
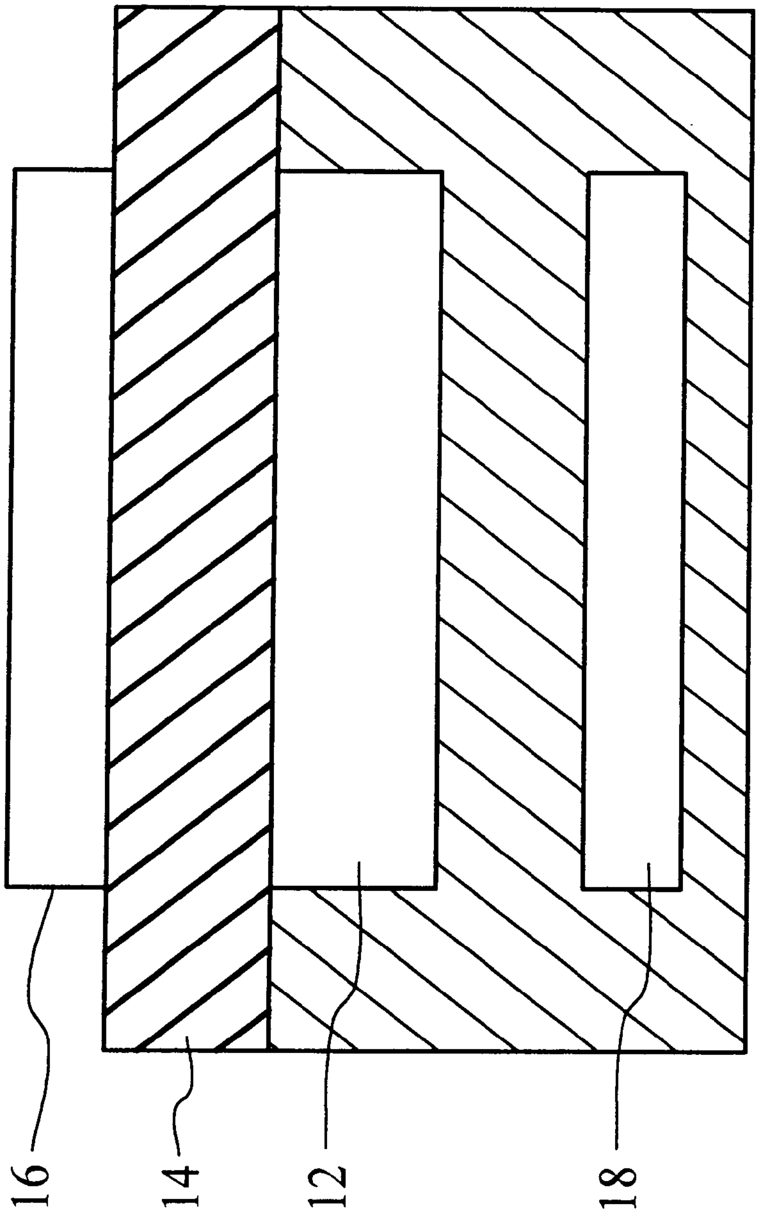
FIG. 1A (PRIOR ART)
FIGS. 1A and 1B illustrate cross sections of exemplary conventional transducers.
Figure 1B:
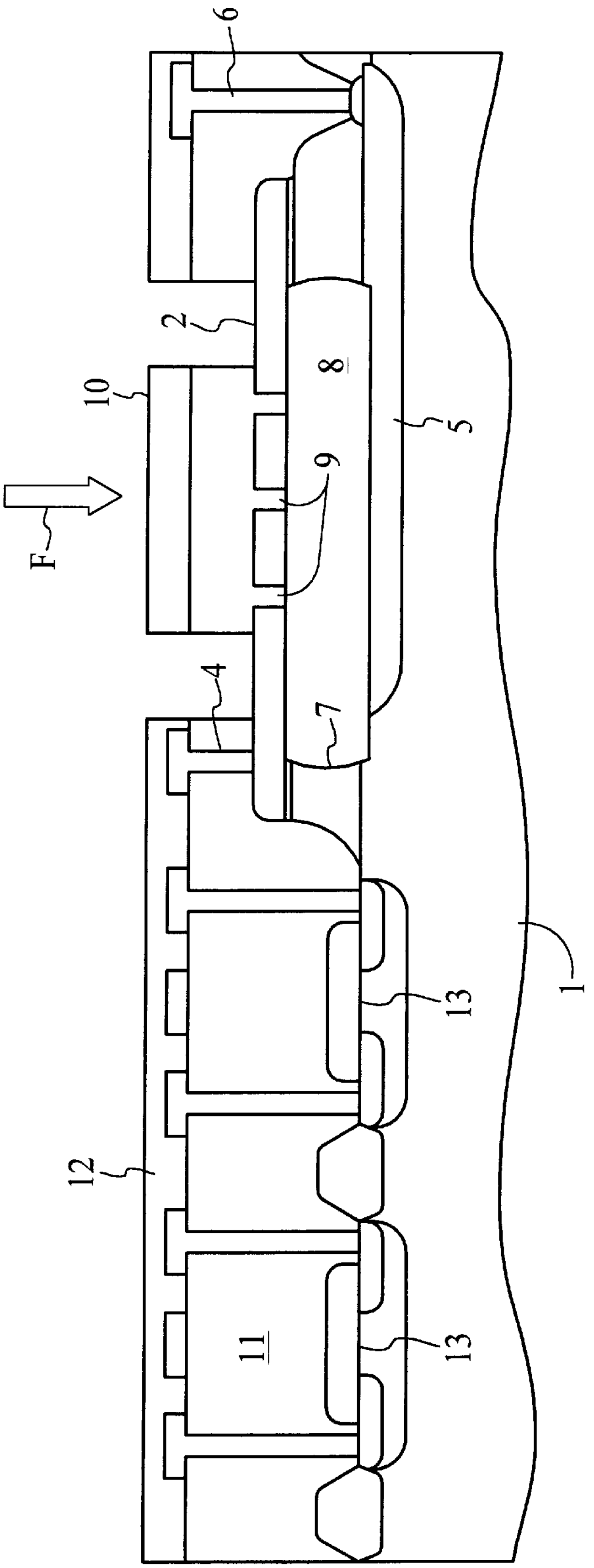
FIG. 1B (PRIOR ART)
Figure 2A:
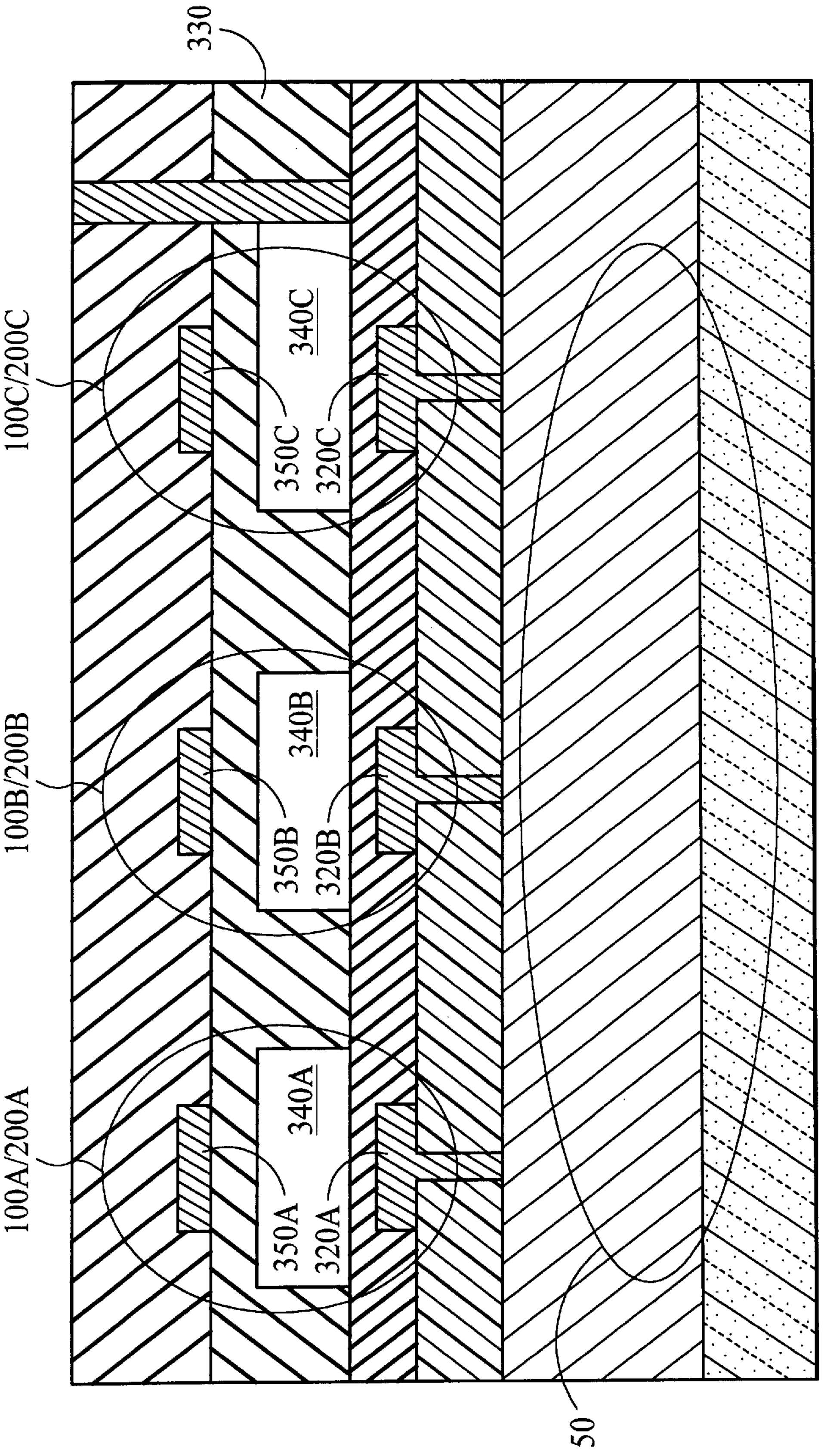
FIGS. 2A and 2B illustrate a cross section and a top view of an array of acoustic transducers formed over electronic circuits disposed on the same integrated circuit according to an embodiment of the present invention.
Figure 2B:
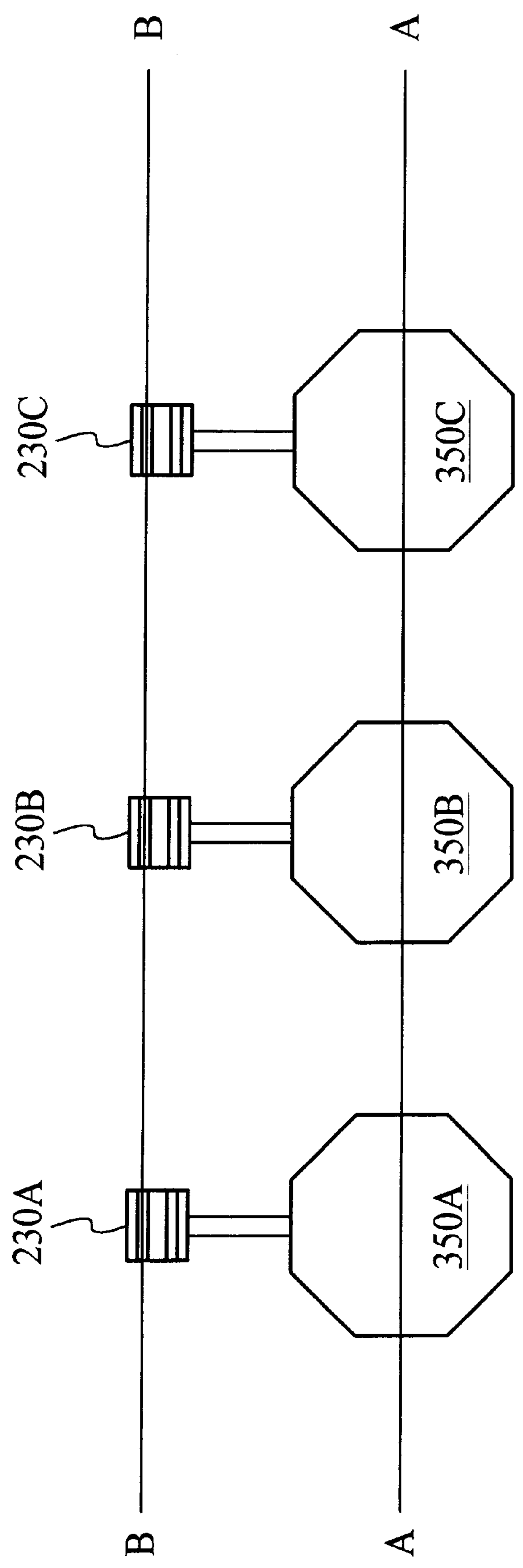

FIGS. 2A and 2B illustrate one embodiment of a part of an array of acoustic transducers formed over circuit devices on the same integrated circuit according to an embodiment of the present invention.

FIG. 2B illustrates a top view at the top electrode level that shows the relative placement of the top electrodes 350A, 350B and 350C of the transducers 100A, 100B and 100C, respectively, in relation to certain interconnects 230A, 230B and 230C, described further hereinafter. The cross section of FIG. 2A can be seen from the line A—A shown in FIG. 2B and illustrates circuit components 50 formed in the semiconductor substrate. The circuit components 50 can form a variety of circuit functions, a number of which are preferred according to the present invention. In particular, analog circuits such as amplifiers, switches, filters, and tuning networks, digital circuits such as multiplexors, counters, and buffers, and mixed signal circuits (circuits containing both digital and analog functions) such as digital-to-analog and analog-to-digital converters have particular usefulness according to the present invention, as will be described hereinafter. Disposed over the circuit components 50 are transducers, such as the illustrated transducers 100A, 100B and 100C. Transducers 100A, 100B and 100C are shown as being composed of a single transducer cell 200A, 200B and 200C, respectively. Of course each transducer 100 may have as few as one or many more than three, such as hundreds or thousands, transducer cells 200 associated with them. Many such transducers 100 will typically be formed at the same time on a wafer, with the wafer cut into different die as is known in the art.

One aspect of the present invention illustrated in FIG. 2A is the placement of transducers 100 over circuit components 50 on the same integrated circuit chip, which can also be viewed as placing the circuit components 50 below the transducers 100. The placement of transducers 100 over circuit components 50 and circuit components 50 below transducers 100 is intended to be broadly construed, unless otherwise stated, to indicate that the transducers 100 and the circuit components 50 are disposed on different layers of the integrated circuit chip. There are, in addition to this aspect, certain specific embodiments, discussed hereinafter, which dictate the particular placement of certain components relative to the specific position of the transducer. Placement of the transducers 100 over the circuit components 50 allows for decreased capacitance with respect to signal routing as compared to conventional transducer systems, the need for a lesser number of electrical connections, and ease of manufacture, as will be described hereinafter. Further, placement of the transducers 100 over the circuit components 50 reduces the space required by associated electrical connections, thereby significantly expanding the total number of transducers that can form part of an array, such as a two-dimensional transducer matrix required in certain systems, such as three-dimensional imaging systems.

Another aspect of the present invention is the usage of interconnects such as interconnects 320A, 320B and 320C and 230A, 230B and 230C (illustrated in FIGS. 2A and 2B and described further hereinafter, to electrically connect the top and bottom electrodes, respectively, of each transducer 100, to the circuit components 50 disposed below. In particular, according to the present invention, since the electronic circuit devices or components 50 have already been formed prior to the formation of the transducers 100, care needs to be taken to ensure that the circuit components 50 are not damaged during the formation of the transducers 100 and the connection of the transducers 100 to the circuit components 50 disposed below, as will be described in detail hereinafter.

Another further aspect of the present invention is the proper preparation of electronic components on the integrated circuit wafer prior to the fabrication of the transducers, and the processing of the transducers over the electronic components, such that the electronic components are not destroyed or otherwise adversely affected due to the fabrication steps required for formation of the transducers. As explained hereinafter, this may require planarization of the surface of the integrated circuit prior to fabrication of the transducers thereover, and will also require the usage of process steps that do not generate sustained levels of heat that will cause the previously formed electronic components to be destroyed or otherwise adversely affected.

Still another aspect of the present invention is the usage of ground planes to reduce different types of noise, such that the signals from the transducers do not affect the other circuit components, and vice-versa.

With the above features of the present invention, it is therefore possible to obtain a microfabricated acoustic transducer on the same integrated circuit chip that contains other circuit devices, particularly other circuit devices formed using standard CMOS or bipolar type processing, which components can become damaged if subjected to high temperatures, typically greater than 400 degrees Celsius, for any significant duration of time, such as the typical deposition time of low pressure chemical vapor deposition (LPCVD) thin films, which is approximately one to eight hours.

Figure 11:
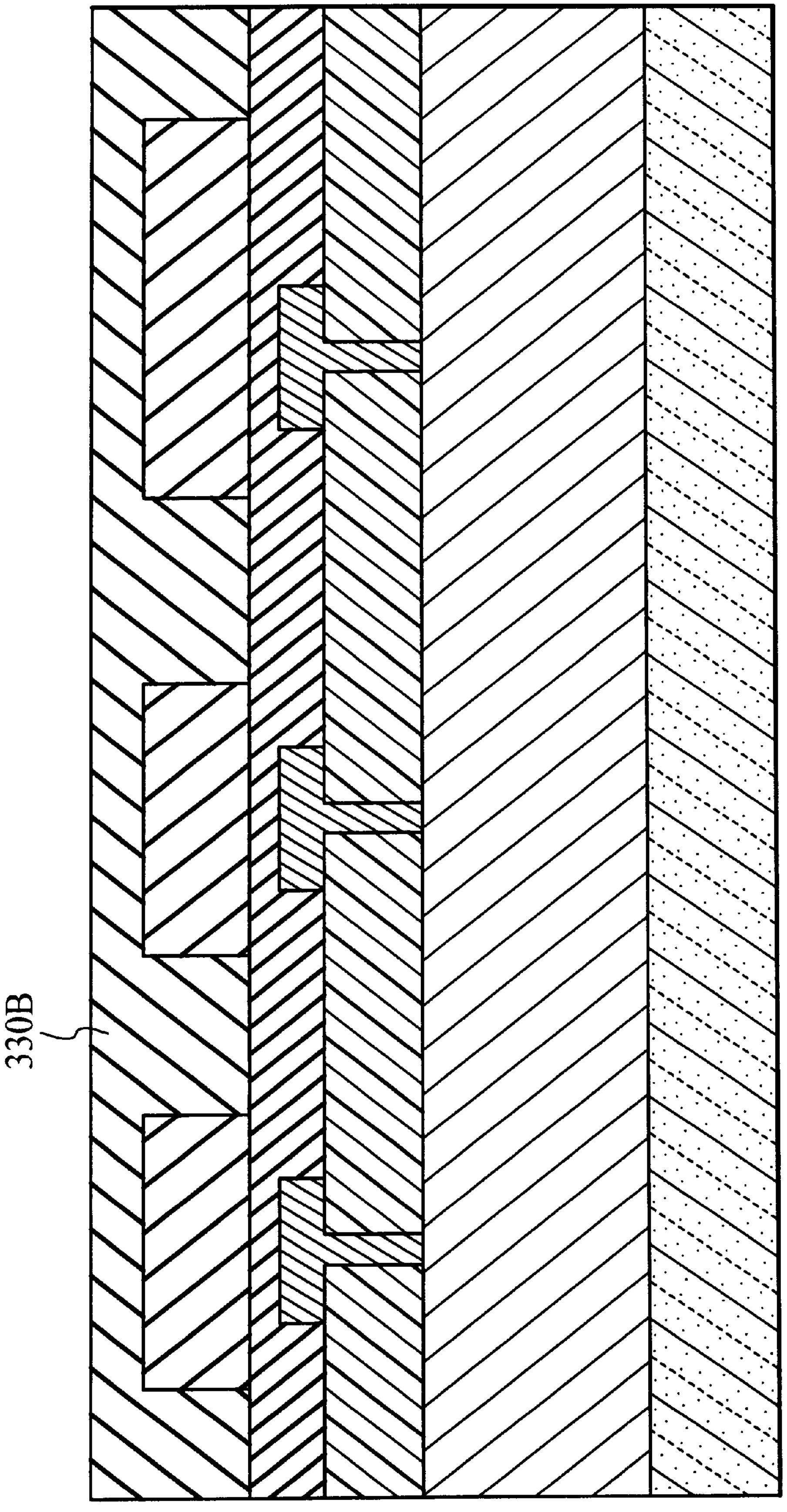
Figure 12:
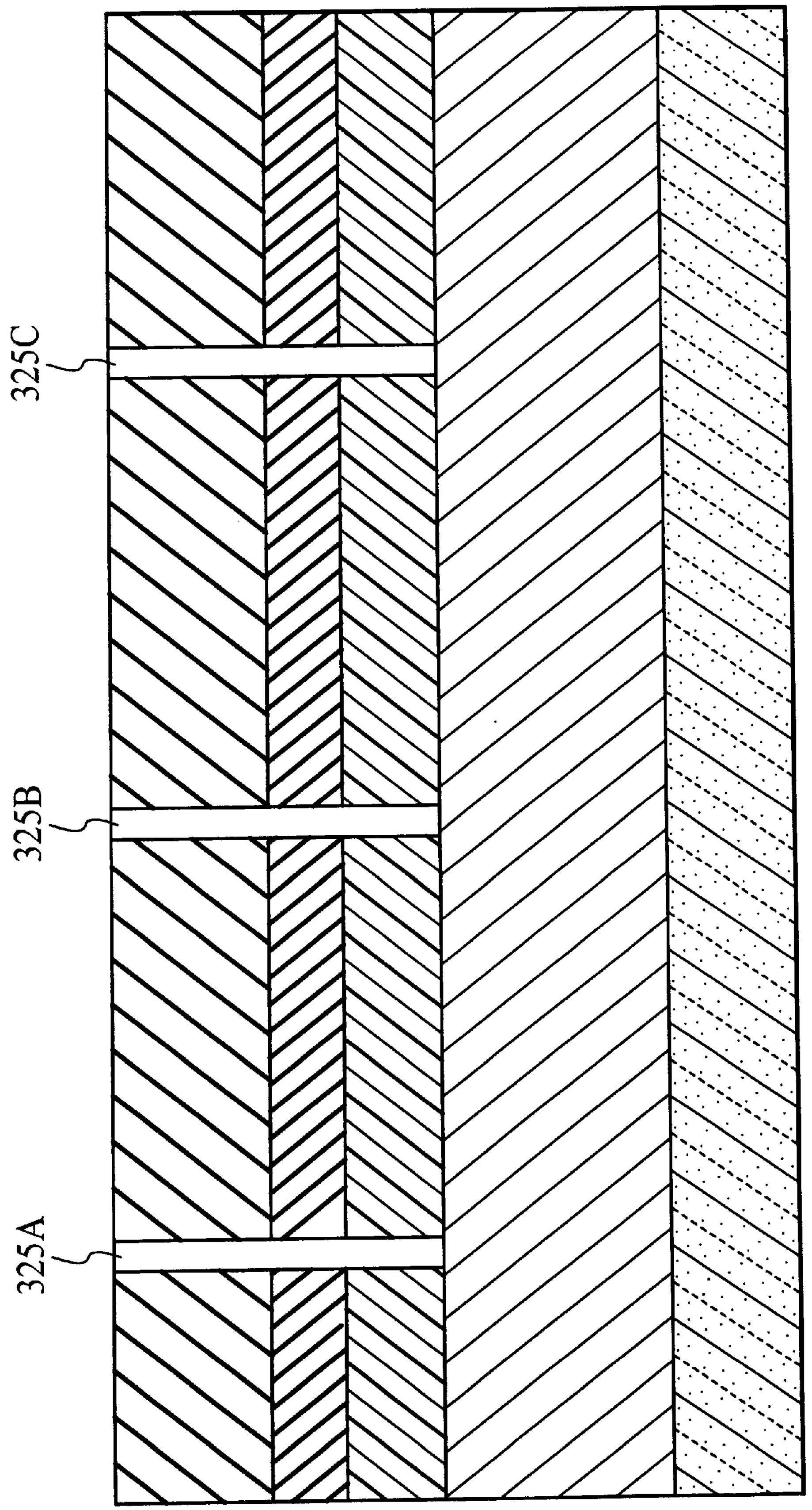

The process of fabricating an array of acoustic transducers 100 on top of circuit components 50 in accordance with a preferred embodiment of the present invention will now be described with reference to FIGS. 3–18. It should be noted that the cross sections of FIGS. 3–11, 13A and 14–18 are taken along the line A—A of FIG. 2B, while the cross sections of FIGS. 12 and 13B are taken along the line B—B of FIG. 2B. It will also be apparent that various different steps and sequences of steps can be used to fabricate acoustic transducers in an array according to the present invention.

Figure 3:
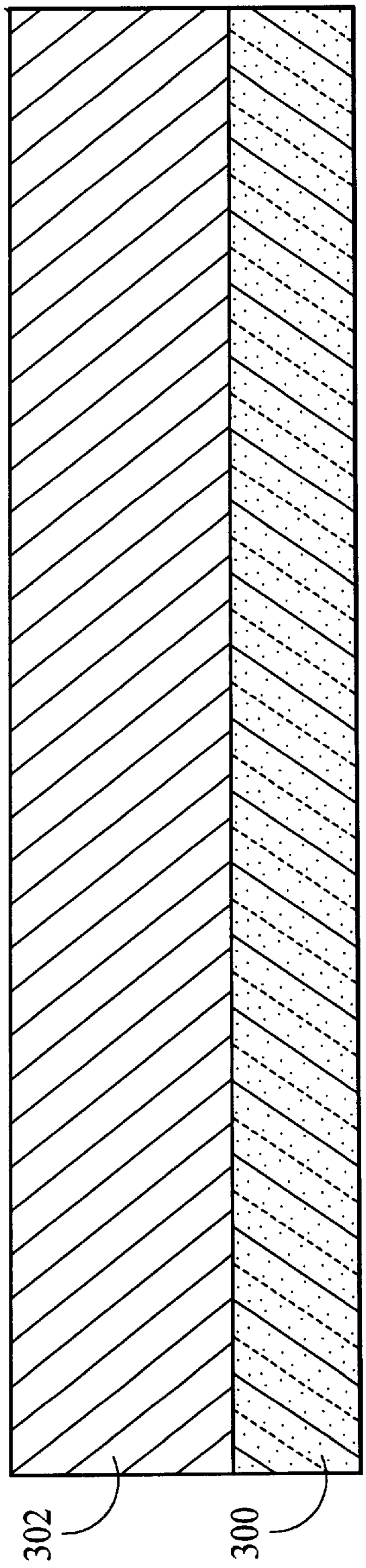
FIGS. 3–18 illustrate the process of forming an array of acoustic transducers over electronic circuits disposed on the same integrated circuit according to an embodiment of the present invention.

Starting with FIG. 3, the process begins with a silicon or other semiconductor substrate 300. Circuit devices 50 are then fabricated in and over the substrate 300 using conventional processing, such as CMOS or bipolar processing. It should be noted that the typical semiconductor, insulator, and conducting layers that are formed over the substrate 300 as part of the circuit devices 50 are illustrated in a single area 302, formed over the substrate 300. While circuit devices 50 can be formed entirely within the substrate 300, more typically they are formed within and over the substrate 300, as illustrated. No matter how circuit devices 50 are fabricated, the transducers 100 can then be fabricated in an array thereover.

Figure 4:
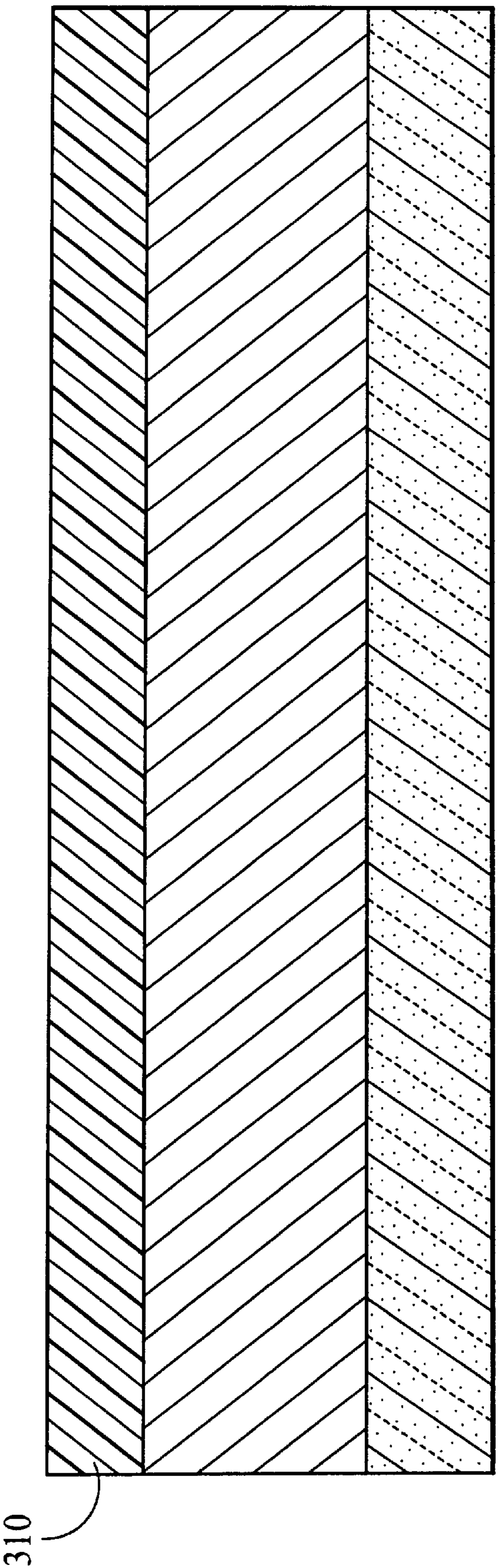

As shown in FIG. 4, there then is formed a protective layer 310 of the integrated circuit, such as low temperature silicon oxide 310, preferably having a thickness in the excess of 10,000 Å. This protective layer 310 will typically also be the top passivation layer used for purposes of protecting the conventionally formed integrated circuits disposed therebelow. Various known techniques, such as chemical mechanical polishing (CMP), can be used to planarize the protective layer 310, which will typically have a non-planar top surface due to the electronic components formed below.

Figure 5:
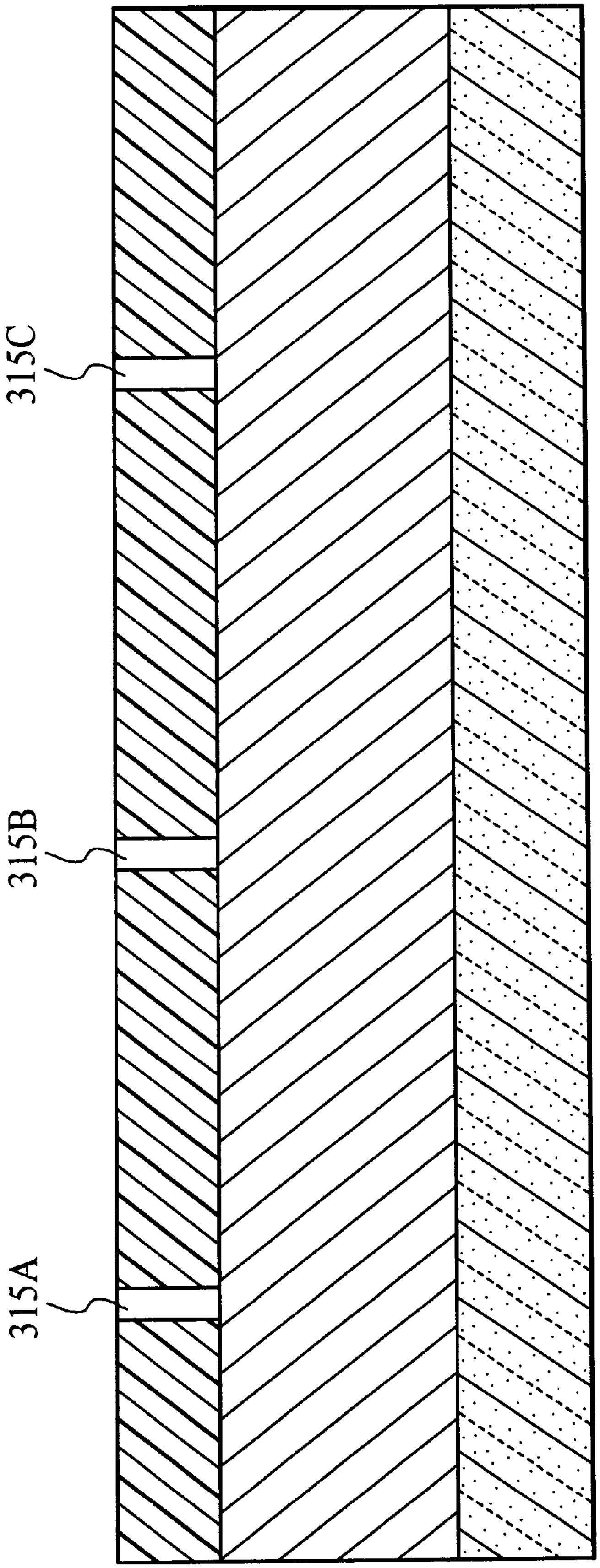

Thereafter, as shown in FIG. 5, holes 315, such as the holes 315A, 315B and 315C are etched in the protective layer, using photolithographic patterning and a suitable etching process, such as a buffered oxide wet etch (a buffered hydrofluoric acid solution) or a plasma etch, or other techniques known in the art, to expose distinct contact areas in the electrical wiring layer or layers associated with the circuit components 50 that each need to be electrically connected to one of the bottom electrodes of one of the transducers 100. The physical layout of the circuit components and the transducer electrodes (both bottom and top electrodes) must be arranged so that the electrical connections can be established without the electrical connections interfering with the transducers 100, the electronics 50, or other electrical connections. Placement of the top electrode interconnections 230, described in detail hereinafter, in areas that are separate from the transducers 100 will prevent this interference from occurring.

Figure 6:
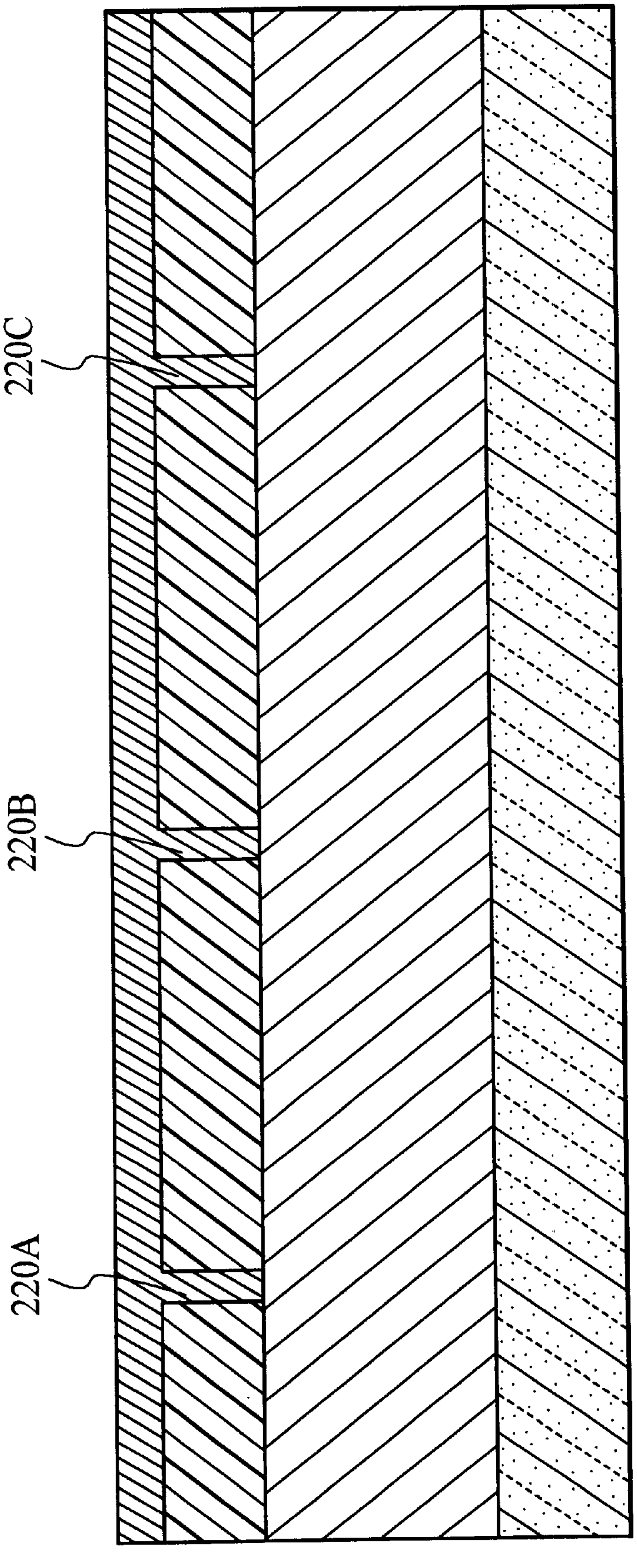
Figure 7:
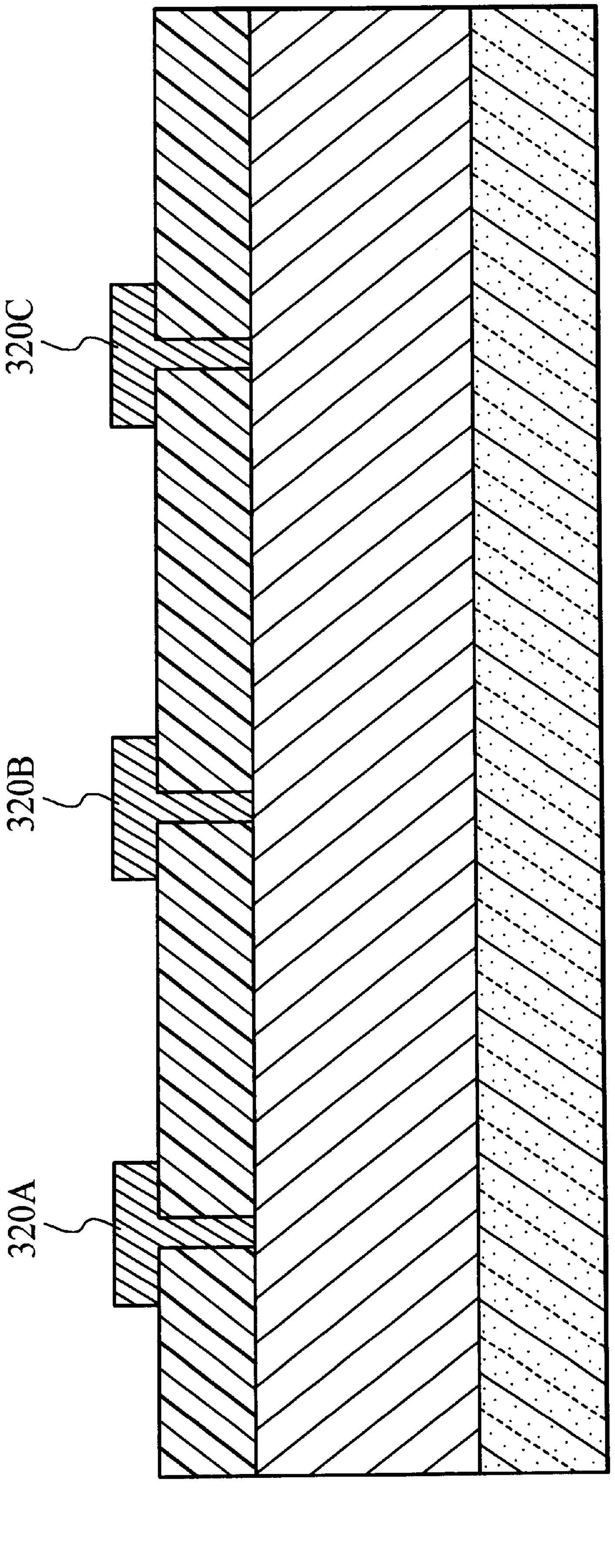

As shown in FIG. 6, thereafter follows the deposition of a conductor 220, which may, for example, have a thickness in the range of 2,500–5,000 Å. In the preferred embodiment, this conductor is aluminum (Al), but the conductor could also be any conductor that can be deposited at low temperatures, such as indium tin oxide (ITO), and other sputtered conductors so long as the heat generated from secondary emission is low enough to maintain the innocuous nature of the fabrication process. Due to the depositing of the conductor 220, the holes 315 are either filled in the case of a relatively thick deposition followed by planarization, or their contour is coated in the case of a conformal thin deposition, thereby creating interconnects 320, which are shown as interconnects 320A, 320B and 320C, also conventionally known as vias, which will allow for the bottom electrodes 320 to be electrically connected to the electrical connections of the circuit components 50. There may also be certain associated interconnects so that certain transducer cells can be connected together. FIG. 7 illustrates the resultant patterned bottom electrodes 320A–C.

Figure 8:
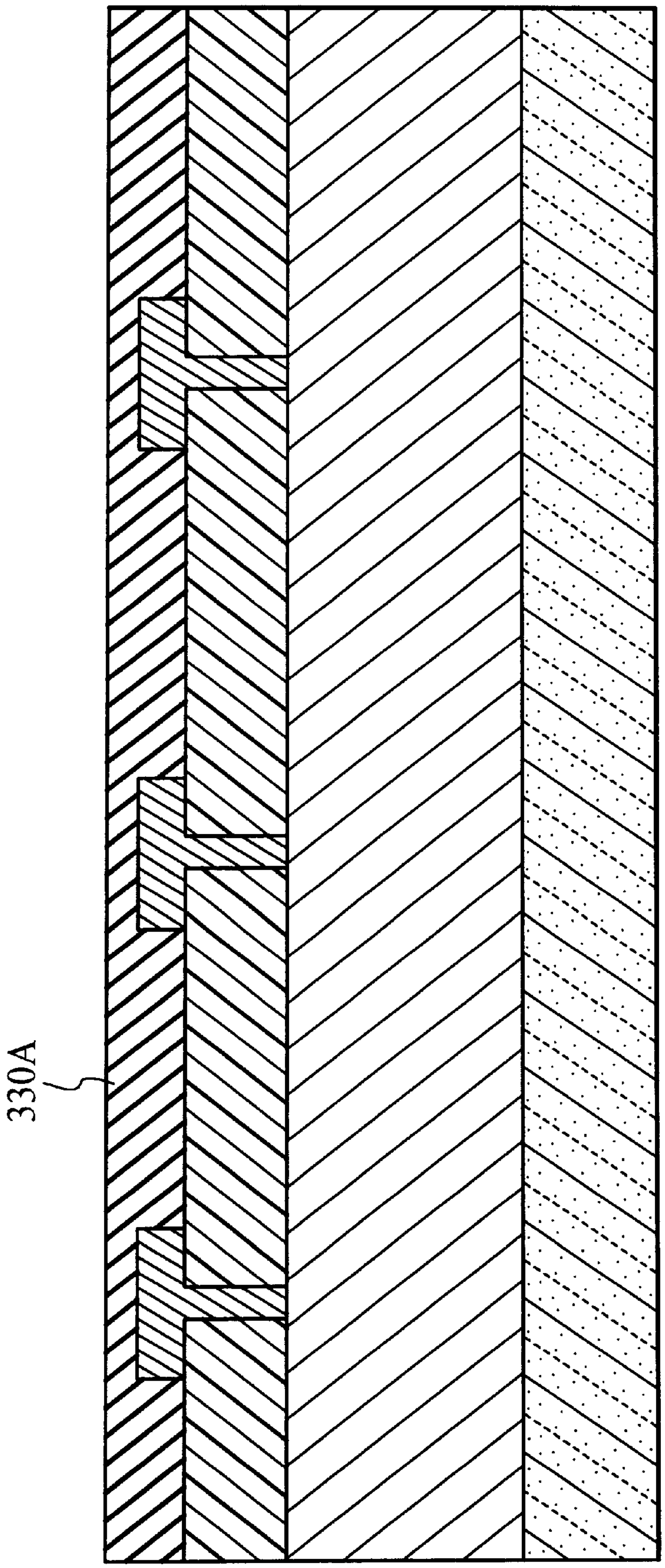

Thereafter, as shown with reference to FIG. 8, a lower insulating film portion 330A of the insulating film 330 is deposited. This lower insulating film portion 330A is an insulator, such as silicon nitride, applied using, for instance a plasma-enhanced chemical vapor deposition (also known as "PECVD nitride"). The applied lower insulating film portion 330A will typically have a measured residual stress that is less than 50 MPas. The residual stress may be adjusted by varying the frequency of the plasma and the relative concentration of nitrogen and silicon carrying gases. The lower insulating film portion 330A will typically be deposited to a thickness in the range of about 0.1 to 0.3 $\mu$m. Further, although illustrated for convenience as being a planarized layer, in fact the deposited lower insulating film portion 330A may not be planarized, instead having a substantially even thickness over the various surfaces, so that the contours of the surface to which the lower insulating film portion 330 is applied will continue to perpetuate through the application of subsequently applied layers, as is known in the art. Planarization can be used, but is not necessary at this stage. Accordingly, since this phenomenon is well understood, it will not be described further hereinafter.

Figure 9:
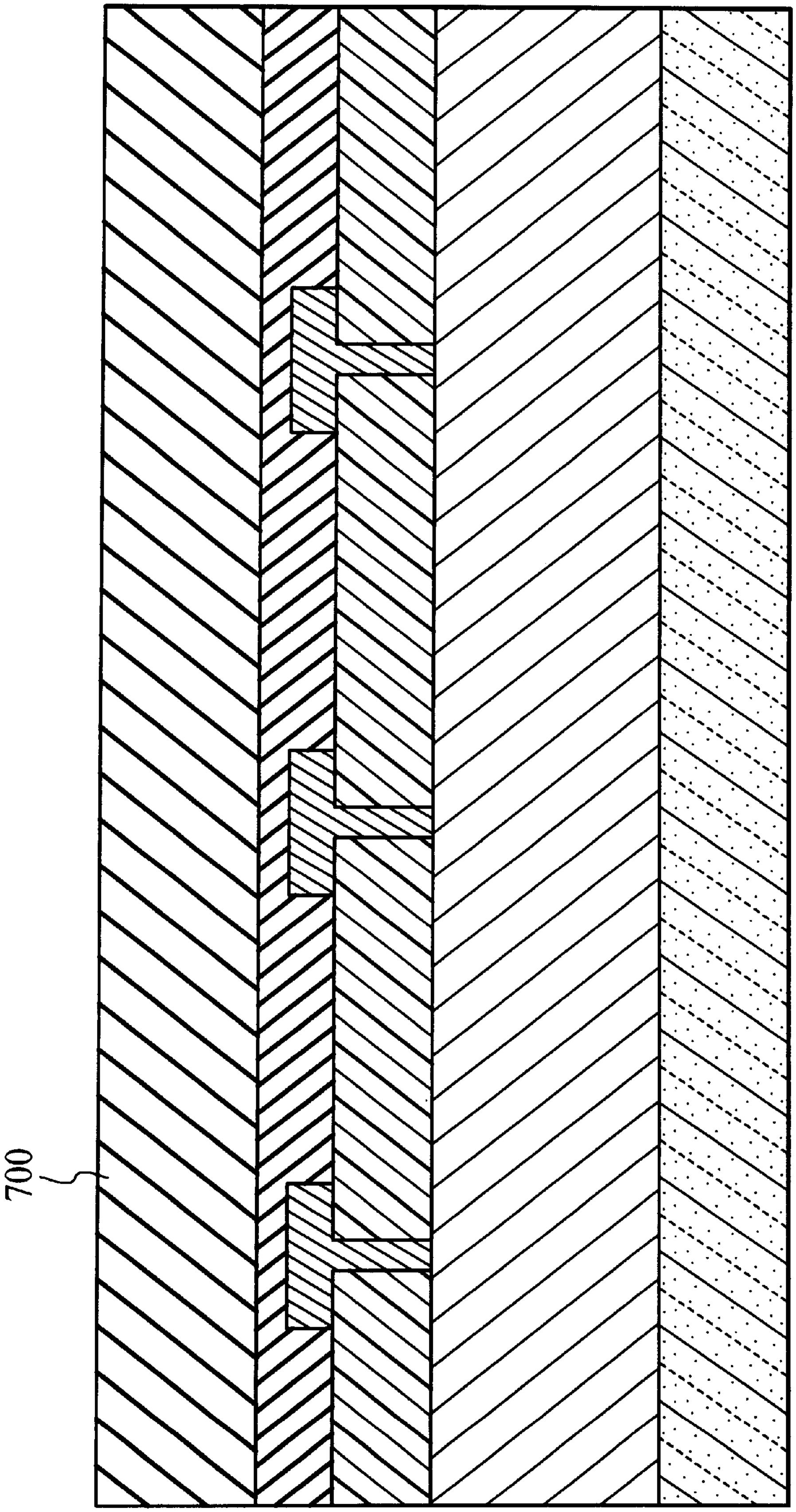
Figure 10:
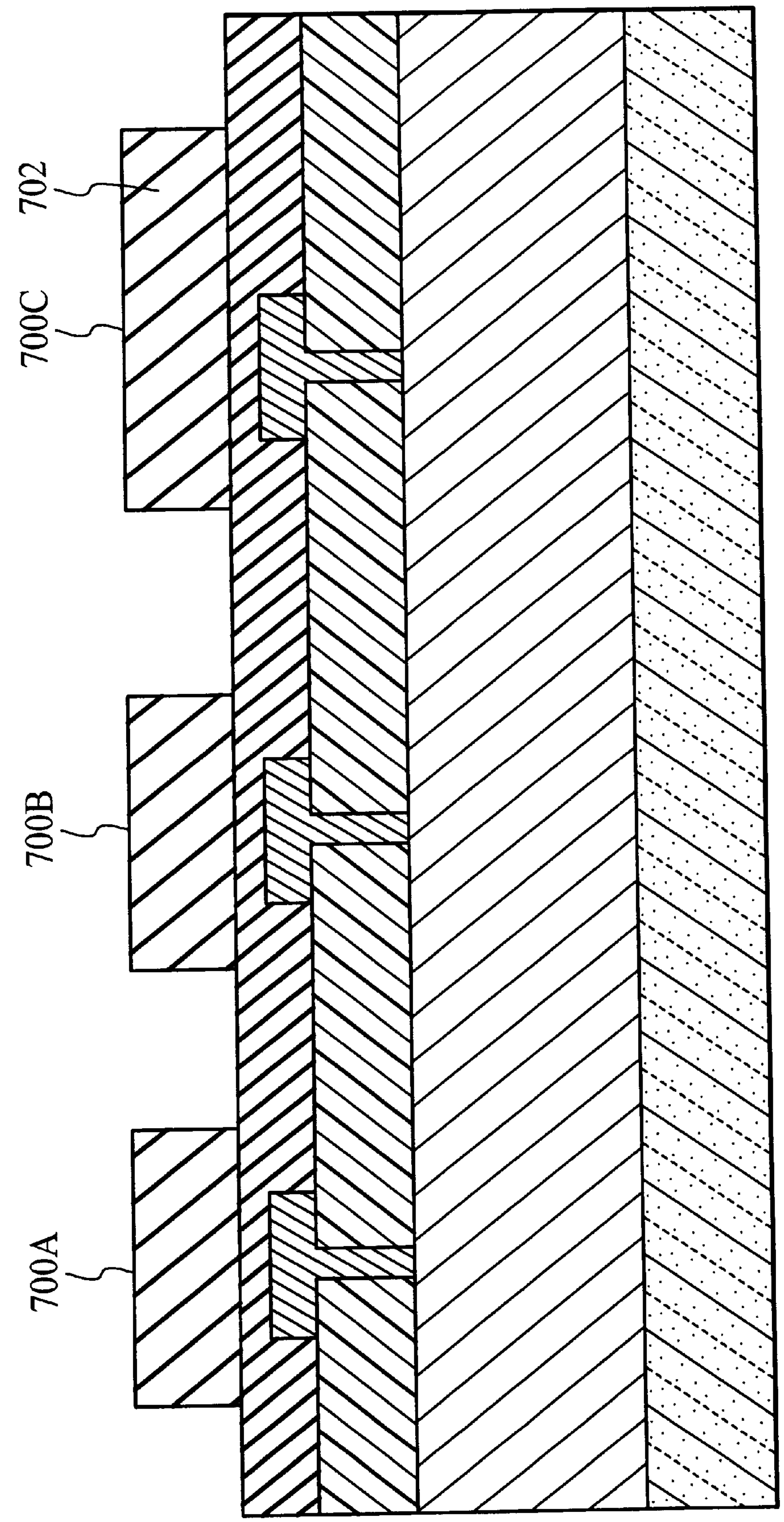

As shown in FIG. 9, a sacrificial layer 700, as known in the art, such as aluminum or low temperature oxide (LTO), or phosphorous doped borosilicate glass (BPSG), is deposited. The deposit thickness typically ranges from 0.05 to 1 $\mu$m, but special applications of such devices may require even thicker depositions. A resist pattern is transferred lithographically, and the sacrificial layer 700 is etched to leave behind a pattern, such as shown in FIG. 10. As illustrated, the sacrificial layer contains portions 700A, 700B and 700C, which will each correspond to a void region that will be made within each transducer 100A, 100B and 100C, respectively. Though the figures herein show only one void region 340 per transducer 100, it is understood that a transducer 100 may be composed of a plurality of transducer cells 200, each having a void region, as noted previously. Also illustrated is a pathway 702, which pathway 702 will allow for the etchant that removes the sacrificial layer to be introduced from a location that is physically separate from the transducers.

A middle insulating film portion 330B is then deposited, preferably an insulator that is the same as that of the lower insulating film portion 330A. Thus, according to the preferred embodiment, PECVD silicon nitride is deposited as the middle insulating film portion 330B to a thickness of about 0.15 $\mu$m over the patterned sacrificial layer 700 to surround and cover the patterned sacrificial layer 700, as illustrated by FIG. 11.

Thereafter, as shown in FIG. 12, which is taken along line B—B, via holes 325, such as via holes 325A, 325B and 325C, are etched through all the layers down to the substrate 300, using a photoresist process, to expose distinct contact areas in the circuit components 50 that each need to be electrically connected to one of the top electrodes of one of the transducers 100 using interconnect lines.

Figure 13A:
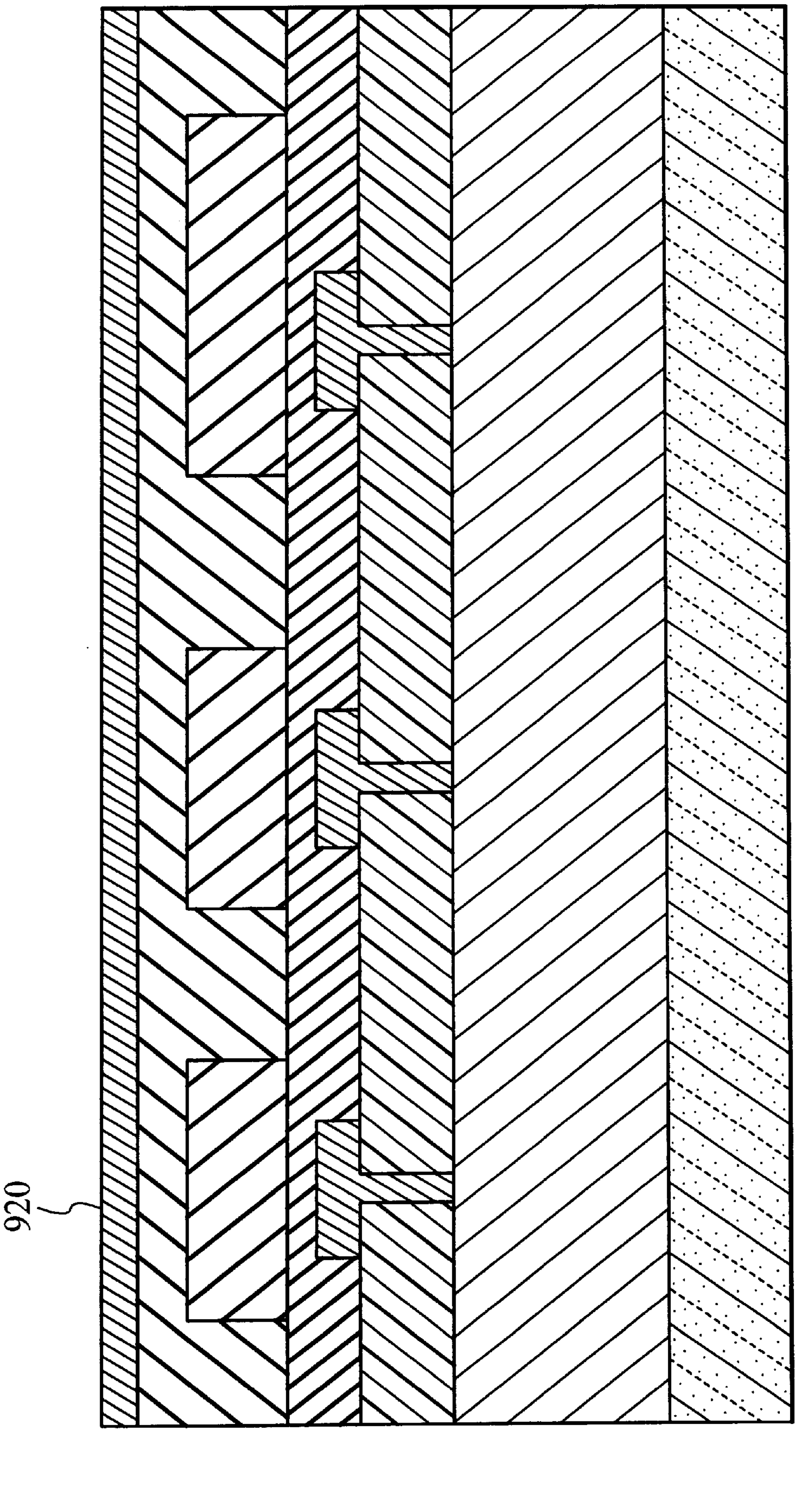
Figure 13B:
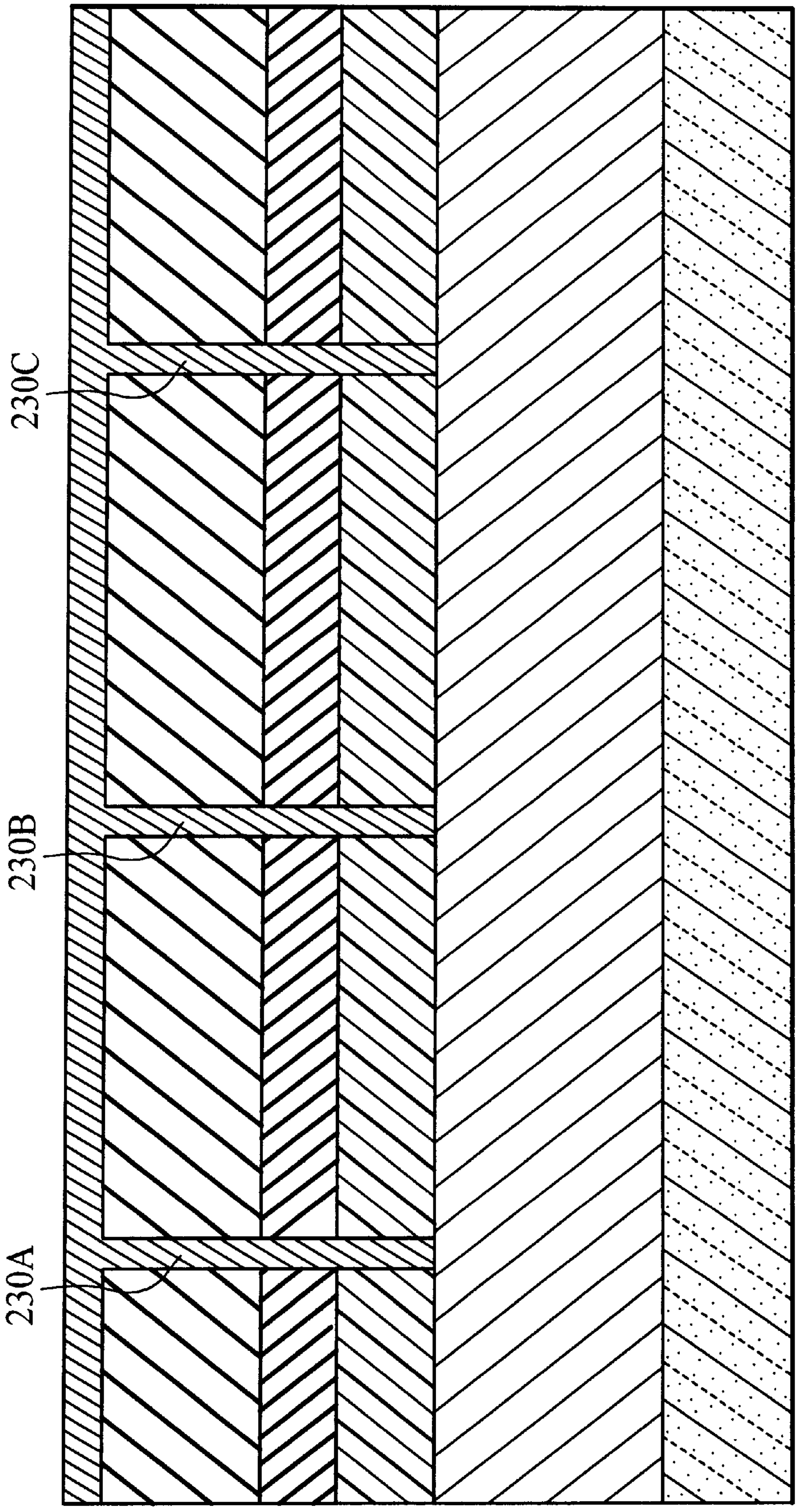

As shown in FIGS. 13A and 13B, the top conductor layer 920 is thereafter deposited, such that interconnect lines 230 form, which are illustrated as interconnects 230A, 230B and 230C in FIG. 13B, which Figure is also taken along the B—B cross section. According to one aspect of the invention it is desirable to have the circuit components associated with each transducer 100 disposed below that component. In order to achieve the desired result with commonly available fabrication processes, the vertical dimension of the interconnect lines 230, as well as interconnect lines 350 discussed hereinafter, is not greater than 5 times the horizontal dimension of the interconnect lines 230.

Figure 14:
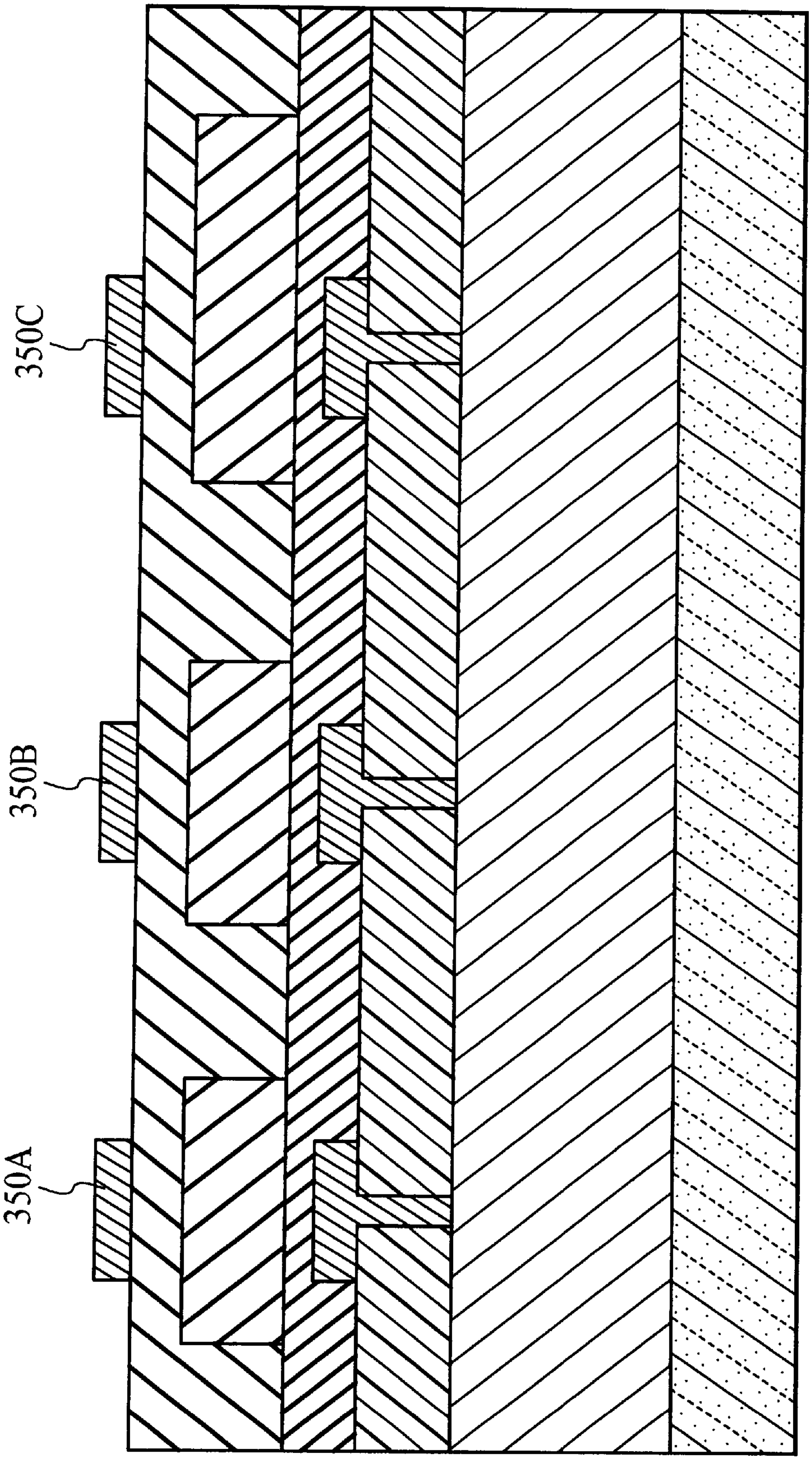

Subsequently, the top conductor layer 920 is etched in a pattern to produce a top electrode 350 and the resulting interconnects, as shown in FIG. 14.

Figure 15:
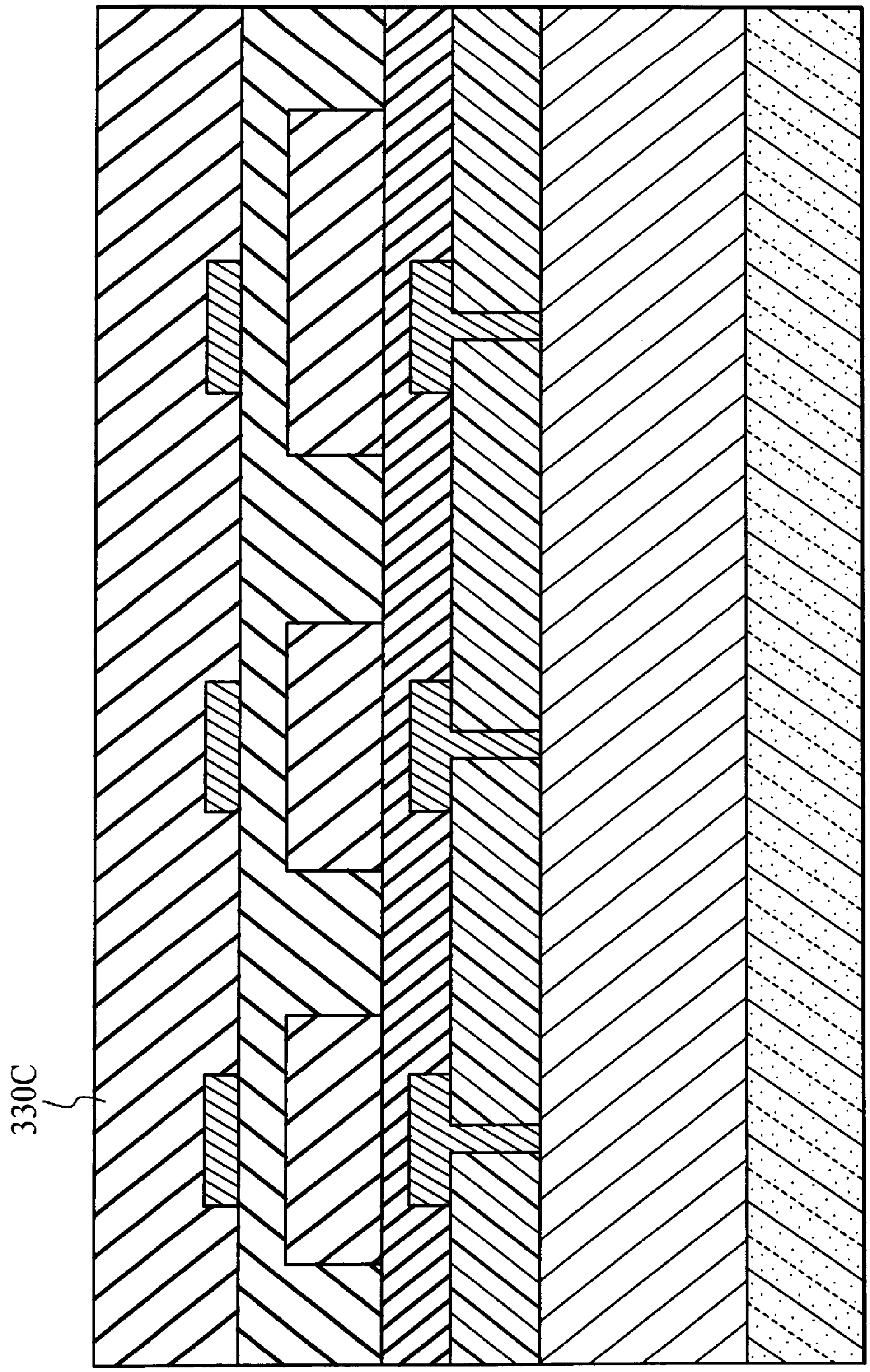

The top insulating film portion 330C of the insulating film 330 is then deposited, as shown in FIG. 15, and the material for the top insulating film portion 330C is preferably the same as that used for the bottom insulating film portion 330A and the middle insulating film portion 330B, previously described.

Figure 16:
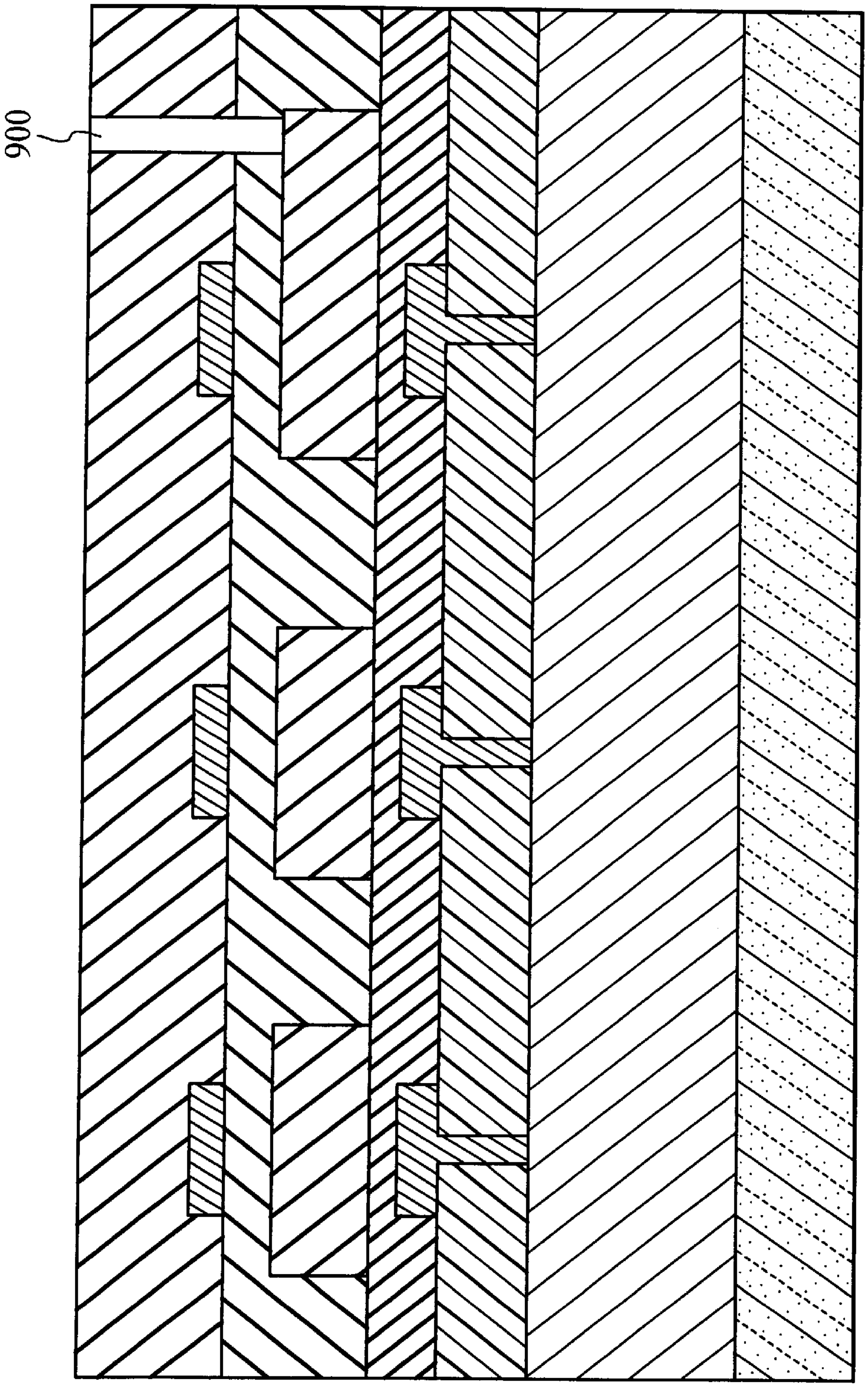
Figure 17:
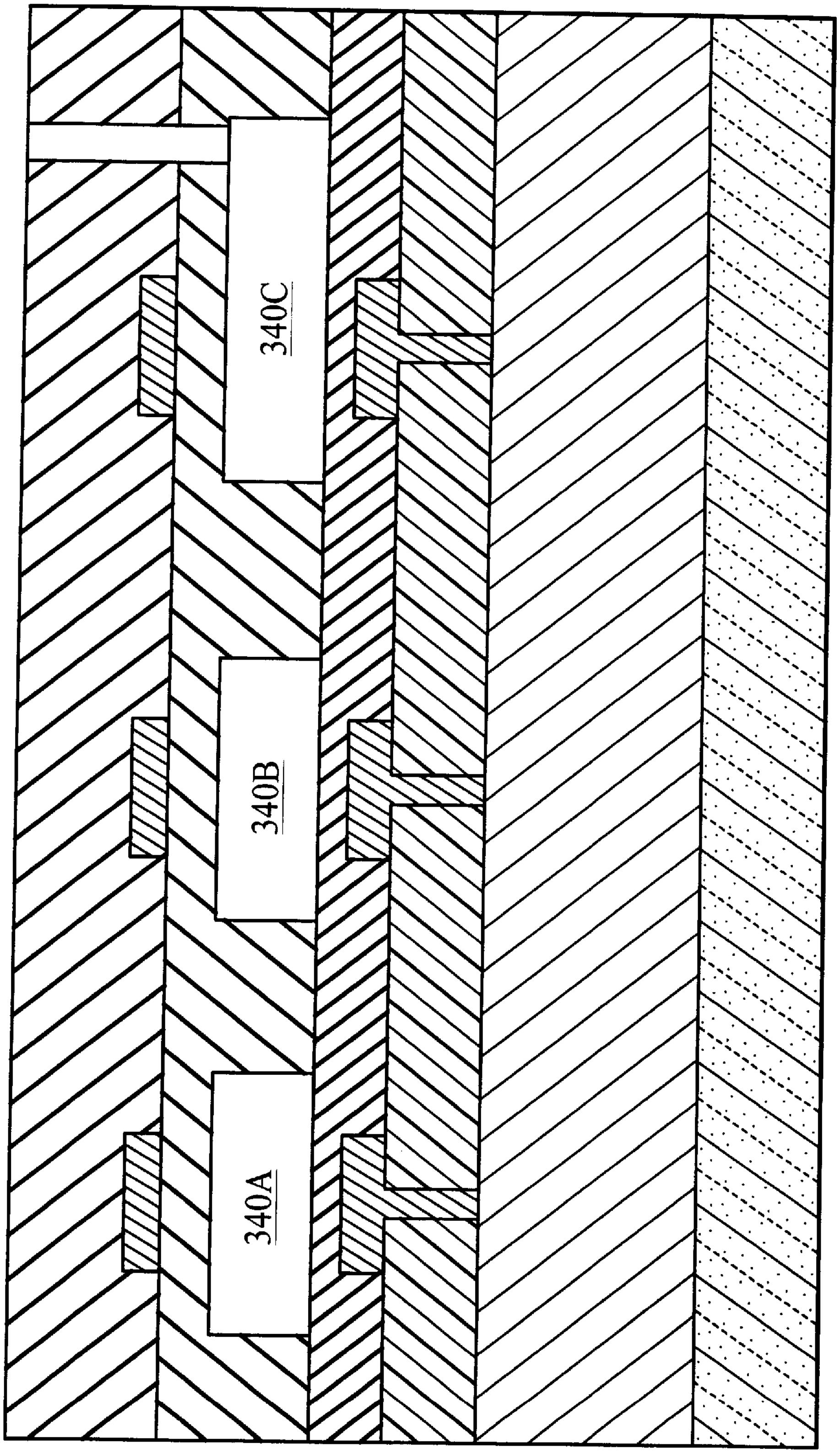
Figure 18:
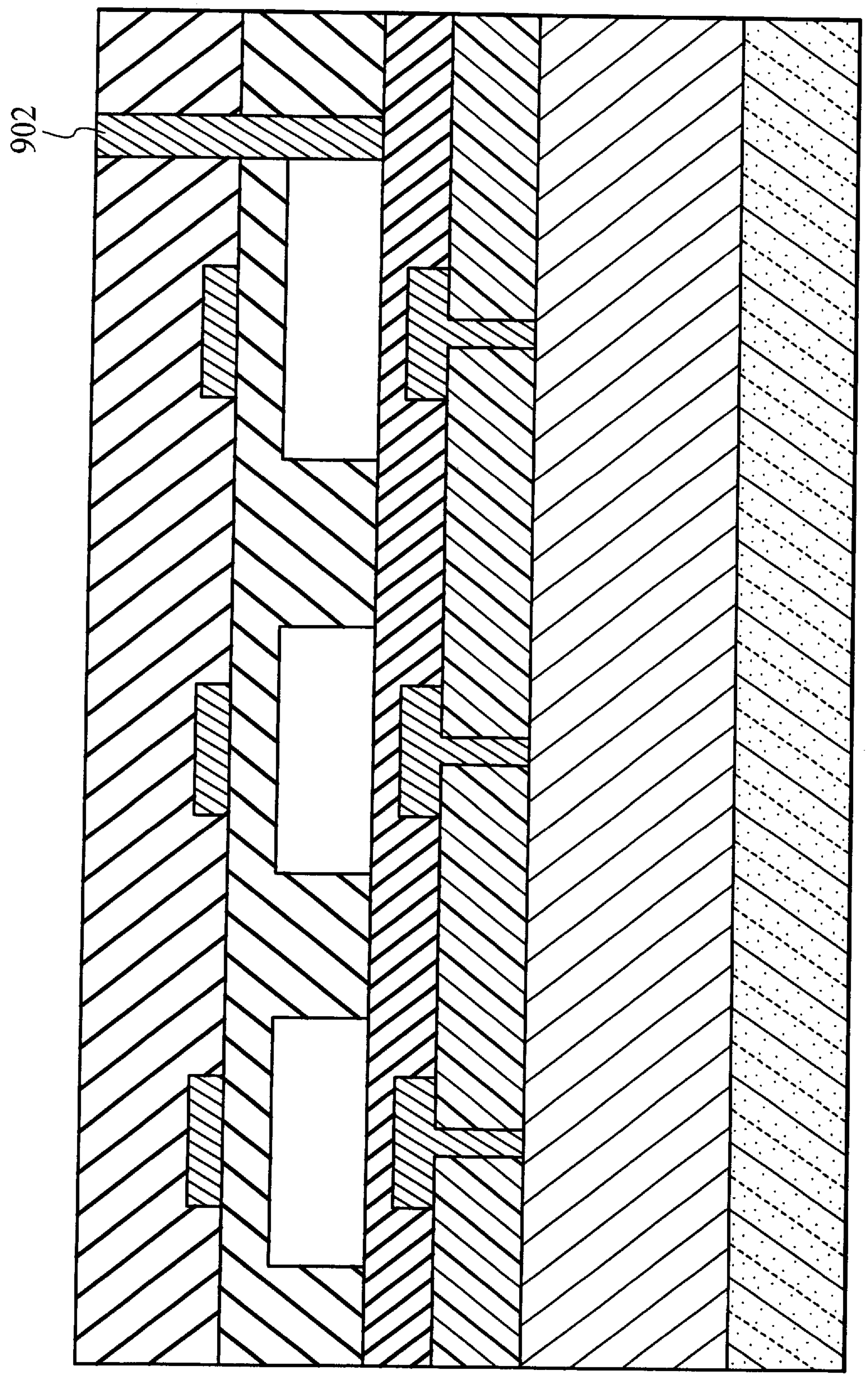

Thereafter, using a combination of forming a resist pattern and a suitable plasma etch, via holes 900 are created to provide for an etchant path as shown in FIG. 16 to the remaining portions of the sacrificial layer, such as portions 700A, 700B, 700C and 702 illustrated in FIG. 10. Accordingly, after the via holes 900 are formed, the remaining portions of the sacrificial layer are then etched away by a sacrificial wet etch or other technique known in the art. For example, buffered hydrofluoric acid can be used in the case of a low temperature oxide (LTO) sacrificial layer 700. The sacrificial etch results in cavities being formed, such as the cavities 340A, 340B and 340C illustrated in FIG. 17. Thereafter, the via holes 900 can be filled in, preferably using the same material as the insulating film 330, if needed, such as for an immersion transducer, as illustrated in FIG. 18. Of course, the additional material added over the top insulating film portion 330C can also become part of the insulating film 330, or it can be subsequently etched from all areas except for the sealing locations. In another embodiment of the invention, the sacrificial etch is performed immediately after the deposition of the middle film portion 330B, and the top insulating film portion 330C serves as the sealing material.

Figure 19:
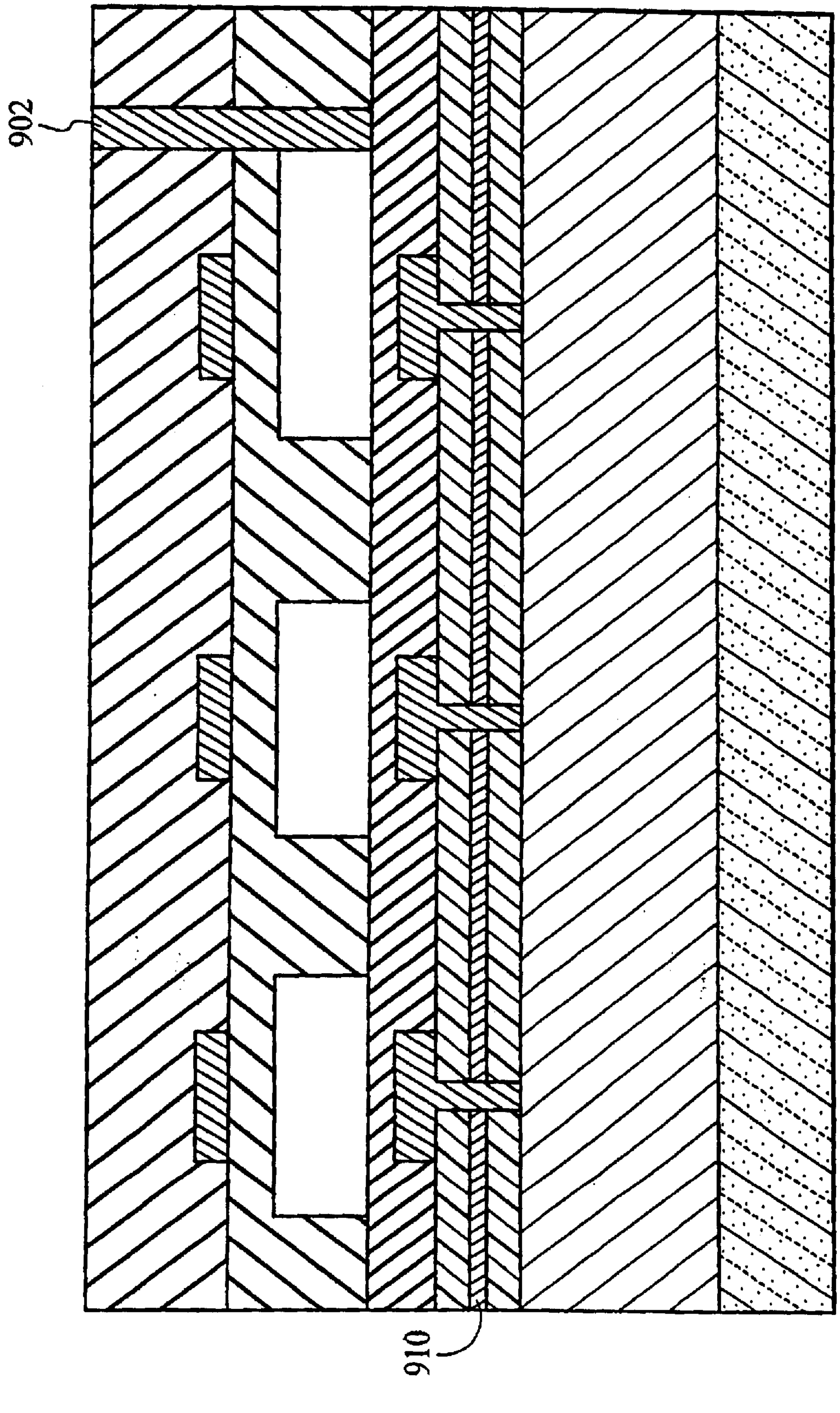
FIGS. 19 and 20A–20B illustrate the usage of ground planes according to the present invention.
Figure 20A:
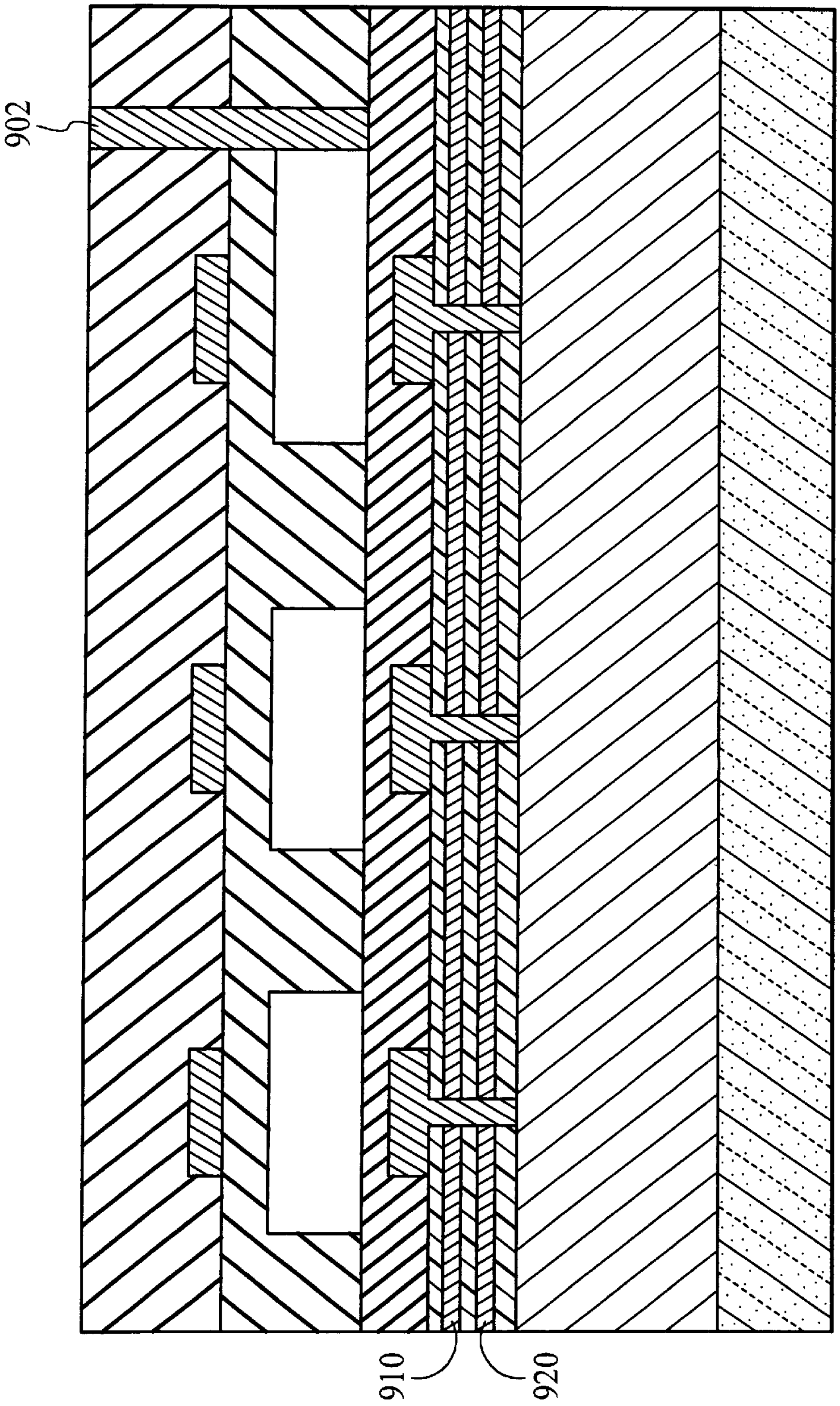
Figure 20B:
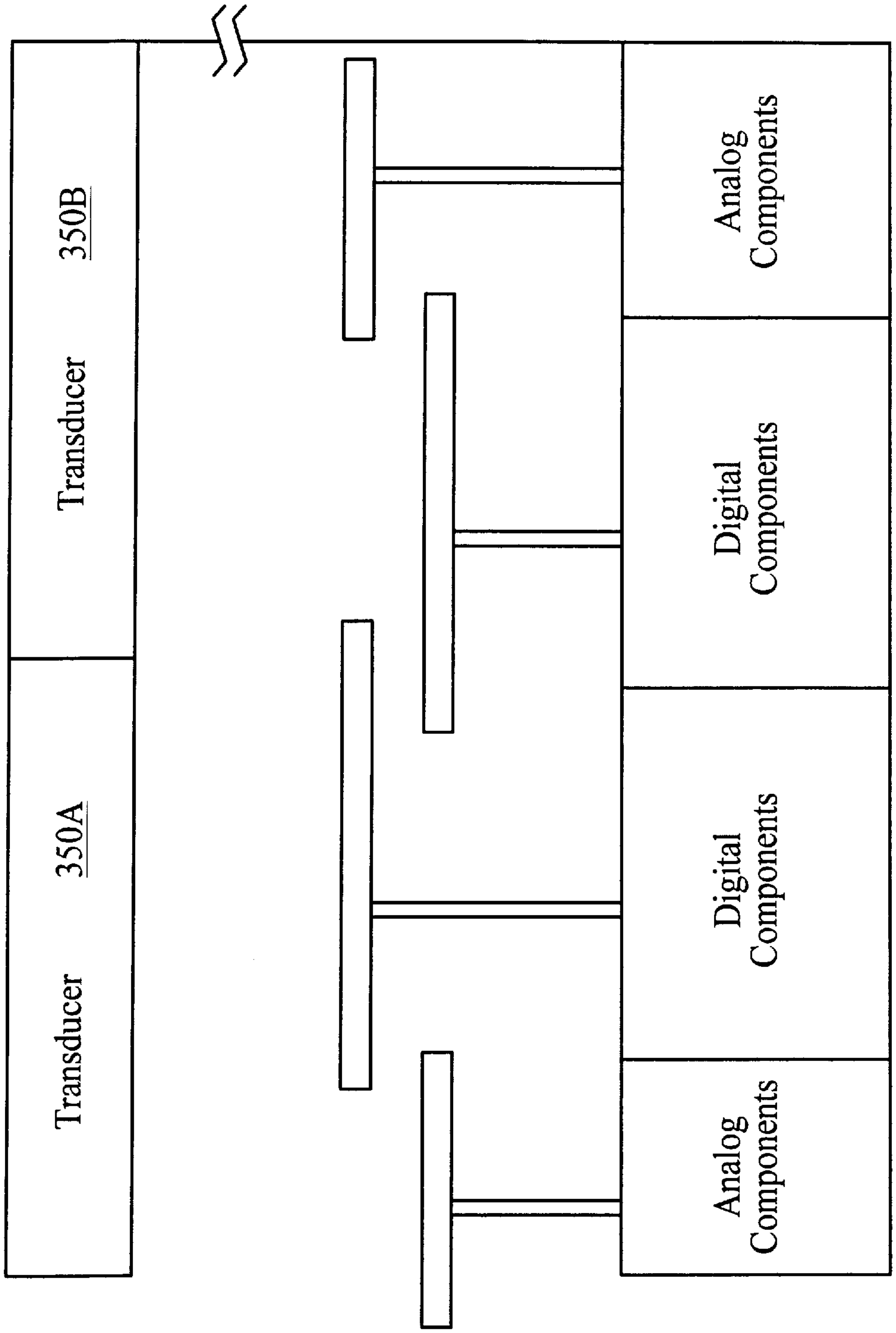

FIGS. 19 and 20A–B illustrate the use of ground planes according to the present invention. FIG. 19 illustrates ground plane 910, a conductor that is preferably used for covering and/or grounding analog components used in accordance with the present invention, although it could also be used for grounding digital components. As is known, ground planes are used to eliminate noise generated from one circuit from interfering with another circuit. In particular, the ground plane 910 is provided within the protective layer 310. To fabricate this ground plane 310, additional process steps are needed to apply the ground plane so that it covers and/or provides a path to ground to the analog components, while still keeping electrically isolated from the ground plane the signal lines 320 and 230 in order to connect to the circuits disposed therebelow. It should be noted that although the ground plane 910 is illustrated in cross section as being along the entire width of the chip, in addition to providing areas for the signals lines 320 and 230, the ground plane will typically be provided so as to cover only the analog components, but not the digital components.

FIGS. 20A and 20B illustrate the usage of two different ground planes 910 and 920, one for the analog components and another for the digital components. The same considerations discussed above apply in providing the two ground planes 910 and 920. As shown in FIG. 20B, which illustrate a simplified diagram illustrating the position of the ground planes 910 and 920 relative to the transducers 100 and the analog and digital components disposed below, which analog and digital components are discussed further hereinafter. As shown, the ground planes 910 and 920 can overlap, although it is preferred to have the analog circuits positioned relative to ground plane 910 and the digital circuits positioned relative to ground plane 920, as shown. Mixed signal circuits would typically be shielded by the digital ground plane.

FIGS. 21 and 22 illustrate two different embodiments of the present invention in which an array of transducers 100 are used. It should be noted that the transducers 100 can have many different sizes. For many applications, each of the transducers 100 may be quite large, such as 500 um×500 um, although sizes of 250 um×250 um are common as well. The most practical range of transducer sizes at present are from 50 um by 50 um (2500 $um^2$) to 500 um by 500 um (250,000 $um^2$). Single transducer catheter products, however, will have transducer sizes typically between about 0.7 mm (millimeter, or 700 um) diameter and 1.9 mm (millimeter, or 1900 um) diameter. Given the potentially large size of these transducers, the present invention has recognized certain layouts of components as being advantageous. While the components used with the transducers 100 can potentially be placed on any location of the integrated circuit chip, the specific placements of the components discussed hereinafter have particular advantages ensuring that signal detected by a transducer 100 is properly transmitted off-chip, and also ensuring that signals are transmitted to a given transducer 100 so that the transducer can generate the corresponding signal for transmission.

Before discussing these particular embodiments, as was mentioned previously, specific circuit devices 50 have been determined to be advantageous will be discussed. An analog amplifier or an array of amplifiers is advantageous because amplification of the signals may be required to drive other circuits, including the cables that connect the chip to additional electronics. Additional analog electronics, such as filters and tuning networks are advantageous because they can condition the signal prior to further processing.

A multiplexor is advantageous because it enables many fewer signal lines to be run off-chip. Rather than having a pair of signal lines for each transducer, all that is needed is a pair of lines connected between the multiplexor and off-chip electronics, as well as control lines to control the multiplexor.

A combination of a multiplexor and an amplifier is also advantageous, since this combination allows for the amplification of the signals detected by the transducers before they pass into the multiplexor because noise in the multiplexor would otherwise degrade the signal to noise ratio of the received signal.

Digital-to-analog and analog-to digital converters are particularly advantageous because they enable the transmission of signals to and from the chip to occur in digital form, thus making them immune from electronic noise. Furthermore, a digital signal can thus be immediately ready for digital signal processing in off-chip electronics.

Still further, memory cells that buffer the data flow to and from the chip are helpful as well.

Devices such as discussed above are well known and their fabrication techniques on integrated circuits are understood. The present invention, however, advantageously arranges these devices in various specific configurations relative to the transducers, in addition to their being disposed below the transducers, as has already been discussed.

Figure 21A:
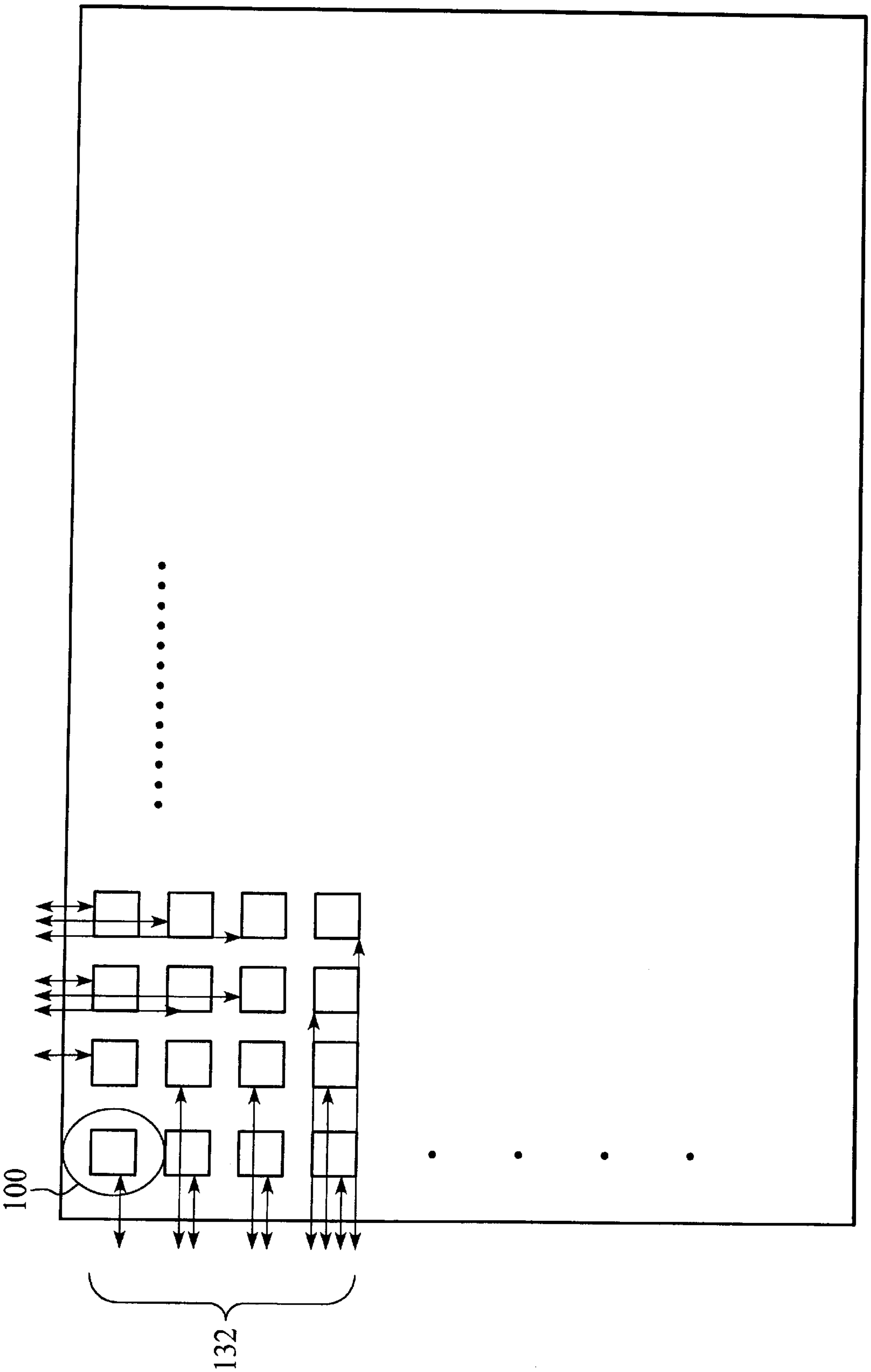
FIGS. 21A–21B and 22A and 22B illustrate a transducer array and components of the transducer array according to certain embodiments of the present invention.
Figure 21B:
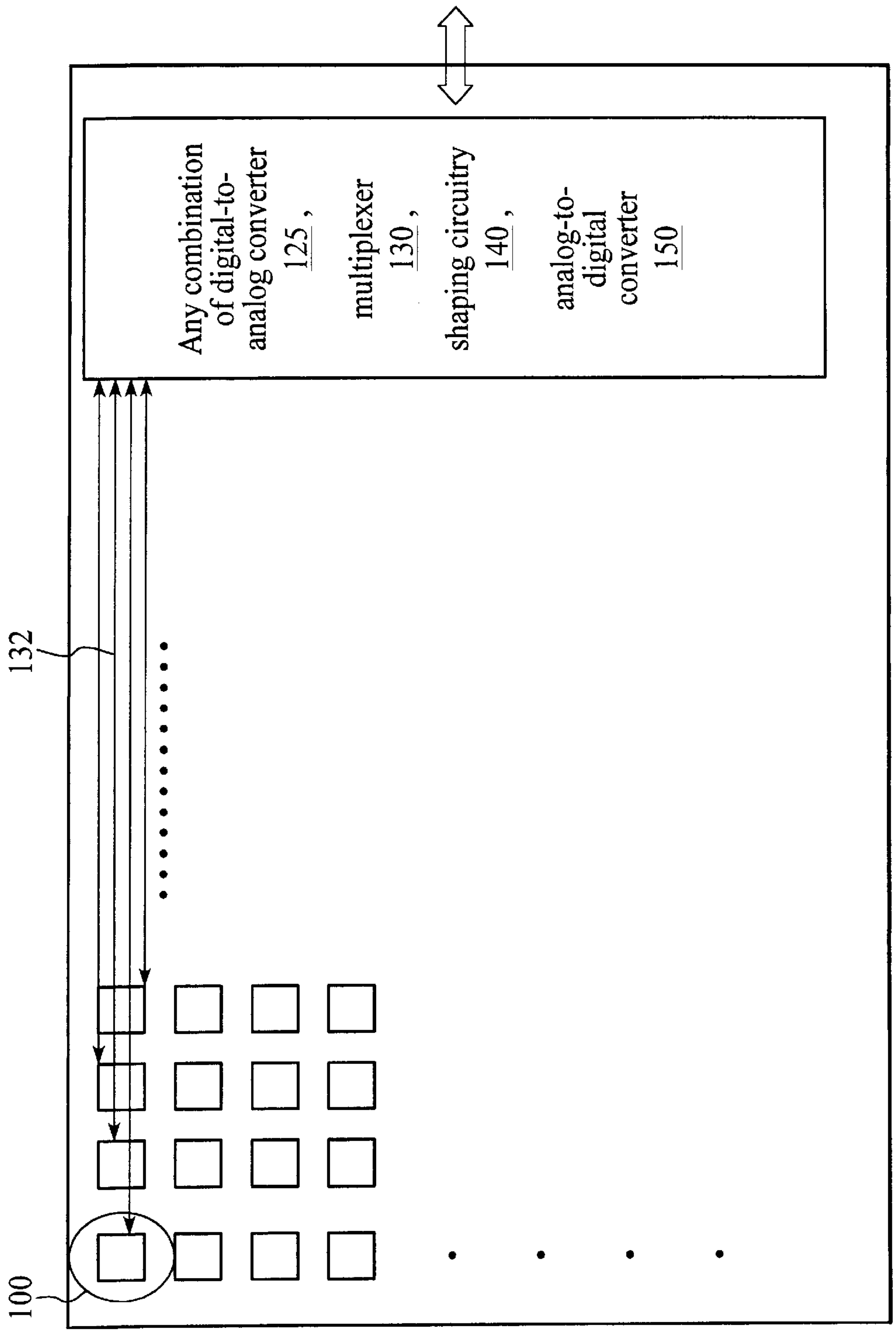

FIGS. 21A and 21B illustrate a top view of a portion of an integrated circuit chip according to the present invention. In FIG. 21A, disposed below each transducer 100 in the array are various circuit devices, as will be discussed hereinafter. As illustrated in FIG. 21B, a portion of the integrated circuit does not have transducers 100 disposed above it, and in that portion are devices that are preferably different from the devices that are disposed below the transducers 100.

Figure 22A:
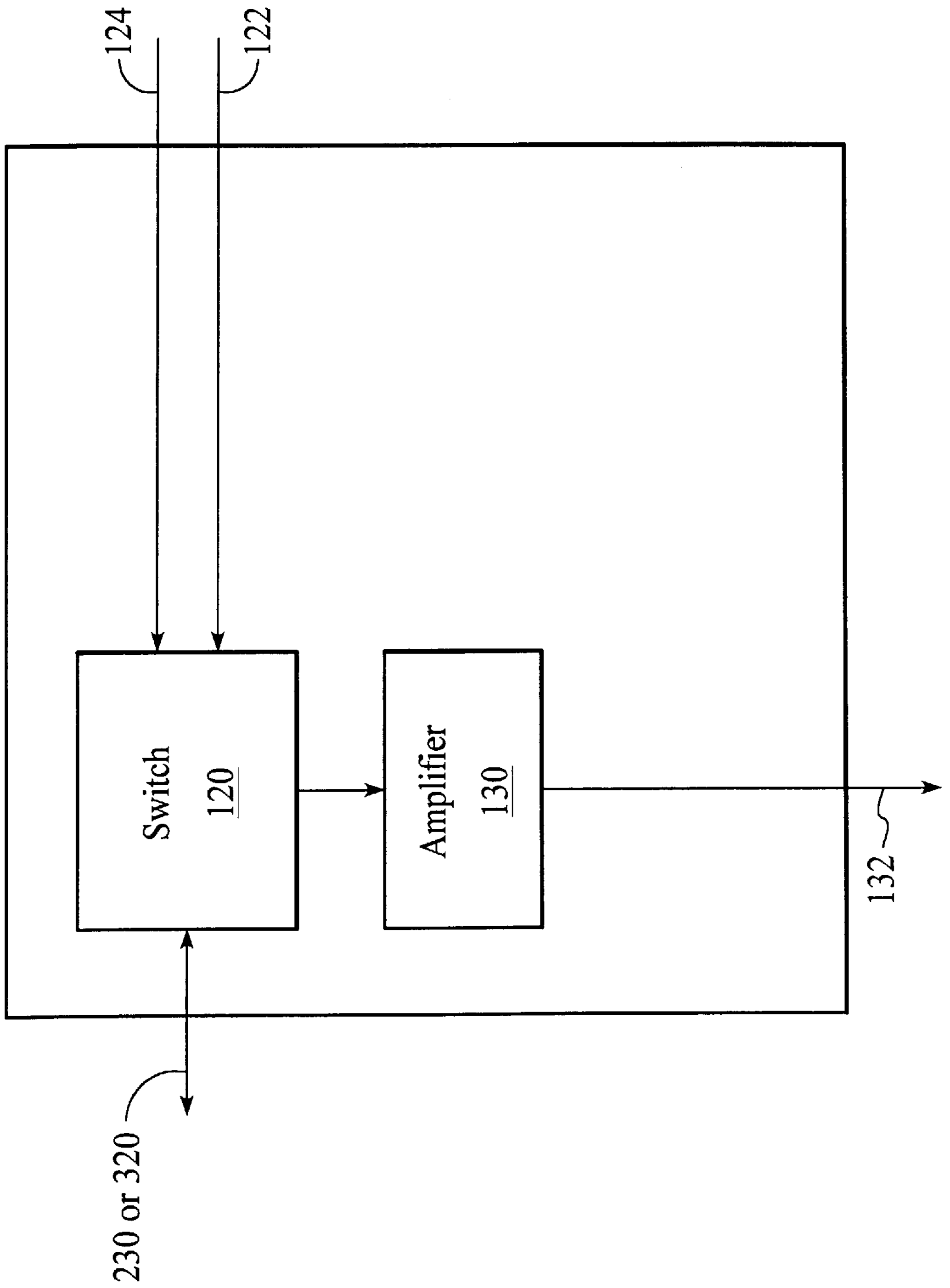
Figure 22B:
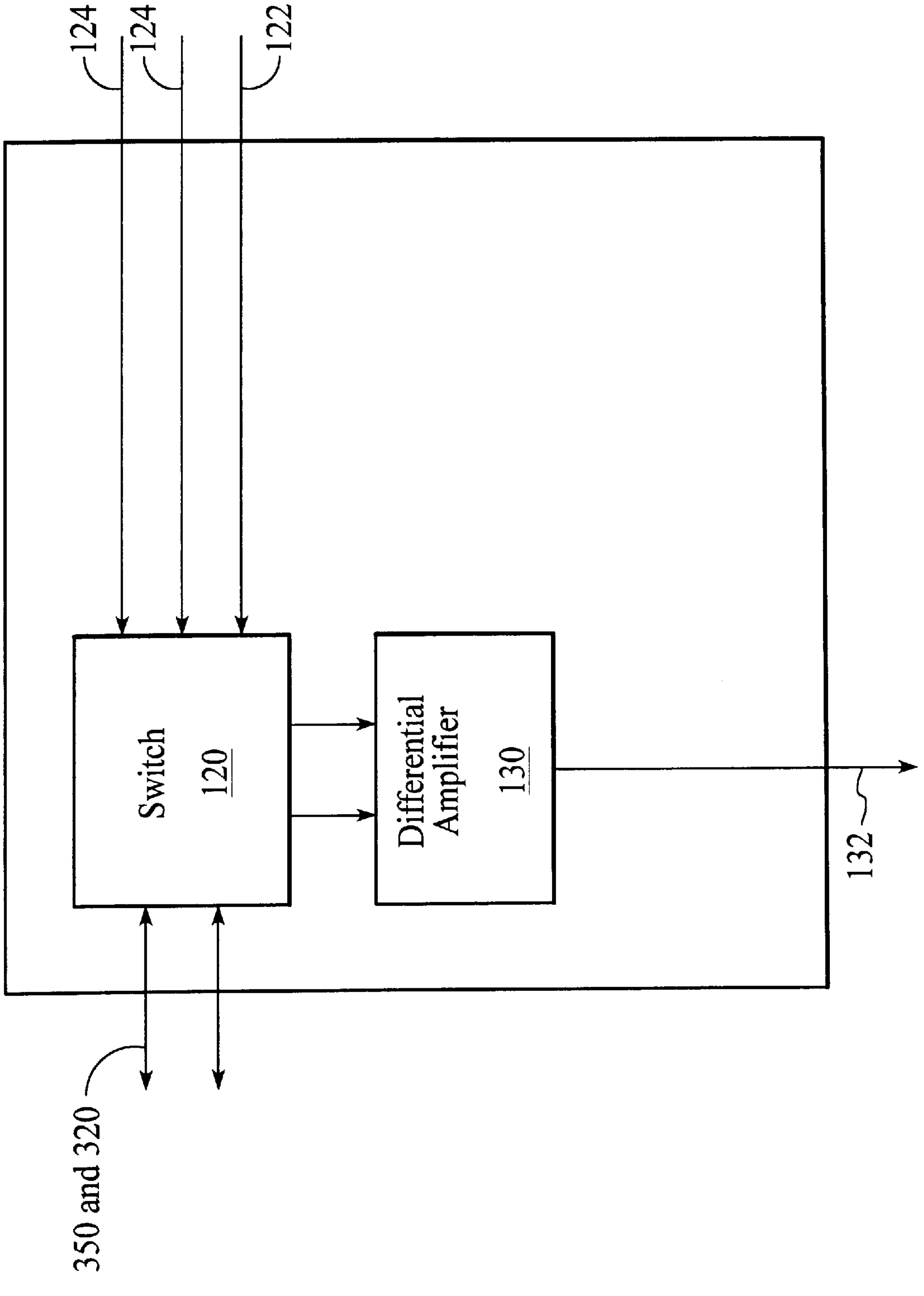

FIGS. 22A and 22B illustrate two different embodiments of devices that are preferably disposed under each transducer 100. FIGS. 22A and 22B both illustrate the usage of a switch 120 and an amplifier associated with each transducer 100. Whereas FIG. 22A illustrates an embodiment in which only one of the top electrode 350 and bottom electrode 320 is connected to the switch 100, with the other of the top electrode 350 or bottom electrode 320, typically top electrode 350, connected to ground. Thus, only one of signal lines 230 or 320 is connected to the switch 120. FIG. 22B, however, illustrates an embodiment in which both the top electrode 350 and bottom electrode 320 is connected to the switch and the amplifier, which can be a differential amplifier, for instance. In either embodiment, the switch 120, controlled by a control line 122, operates to either allow for excitation or interrogation of the transducer 100, although it will be understood that if the transducer is not used for both excitation and interrogation, a switch 120 will not be needed. In its simplest implementation, switch 120 can be a pair of MOS transistors with the control line 122 connected to the gates of the MOS transistors. During excitation, excitation signal(s) received along line or lines 124 is(are) passed to the transducer 100 via the switch 120 to cause a corresponding acoustic signal. During interrogation, the transducer signals that are detected by a transducer 100 are passed along signal lines 230 and/or 320, and the switch 120 connects the transducer signals to the amplifier 130, where they are amplified by an amplifier 130 to generate an amplified transducer signal. The amplifier will also receive power, typically Vcc or a derivative of Vcc, in order to perform its amplification. Since the switch 120 and the amplifier 130 are both disposed below the particular transducer 100, the received signals are amplified prior to their being disturbed by other electrical components. Thus, the signal-to-noise ratio is very high and the accuracy of the transducer thereby enhanced. The amplifier 130 then outputs the amplified transducer signal along line 132.

In the embodiment of FIG. 21A, the amplified transducer signals transmitted along line 132 are then directly sent off-chip for further processing. Accordingly, due to the number of signal lines 132 that need a connection to a pin, in this embodiment it is desirable to use all of the outer area, as shown. Alternatively, output pins can also be run through the bottom of the chip, using conventional techniques. It should be recognized, however, that the size of the array in this embodiment may be limited by the available area for output pins, particularly if output pins cannot be run through the bottom of the chip.

In, however, the embodiment illustrated by FIG. 21B, the amplified transducer signals transmitted along line 132 are further processed on-chip. In particular, any combination of a multiplexor 130, shaping circuitry 140, and a digital-to-analog converter 150 can be placed on-chip for this further processing. Also, a digital to analog converter can be used to obtain analog excitation signals used to excite the transducers 100 and thus cause the associated acoustic signal.

The usage of a multiplexor 130 allows for various amplified transducer signals detected by various transducers 100 and amplified by amplifiers 130 to be output using the same output line of the multiplexor 130, which multiplexor is controlled by control signals received from off-chip. This helps alleviate the restriction on the number of available pins. There may be, for example, one multiplexor per row or one per column of transducers 100 in the array, although other combinations will work. A trade off between the number of output pins and the speed at which the detected signals can be output exists and the proper number of multiplexors will depend on the desired performance. The more multiplexors (capable of operating upon a predetermined number input lines), the faster the speed, but more output and control pins will be required.

The usage of shaping circuitry 140 allows for filtering of the signals, insertion of a delay line for purposes of obtaining a phase delay, and other waveshaping. Such circuitry can be inserted either before or after the multiplexor 130.

The analog-to-digital converter 150, as is known converts an analog signal to a digital representation of that signal. Analog to digital converter 150 will be placed between the chip output and the multiplexor 130. The analog to digital converter will also receive, in addition to the signals needing conversion, power, the system clock and a signal indicating that a new sample should be taken in order to properly operate, as is known.

Figure 23:
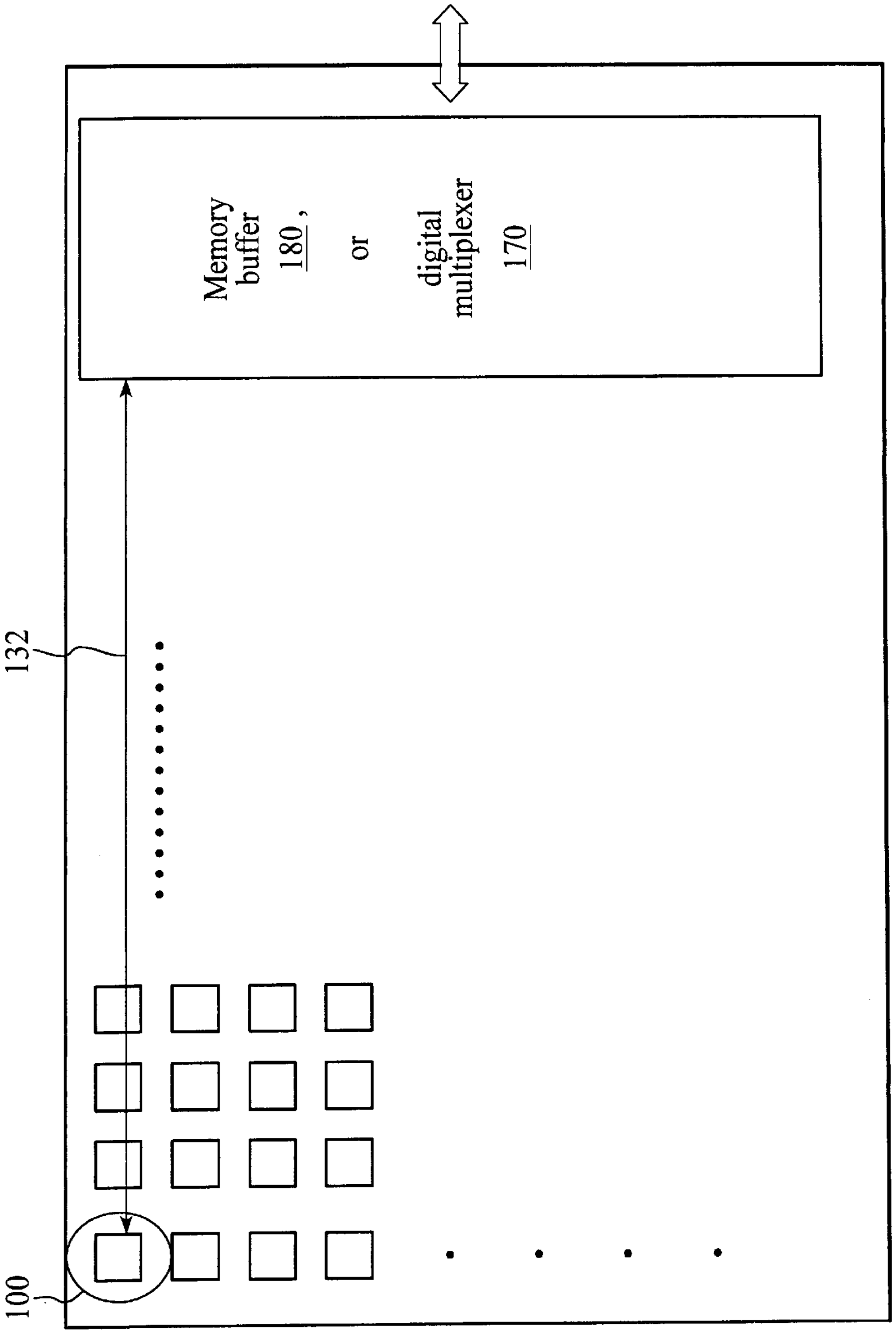
FIGS. 23 and 24A and 24B illustrate a transducer array and components of the transducer array according to other embodiments of the present invention.
Figure 24A:
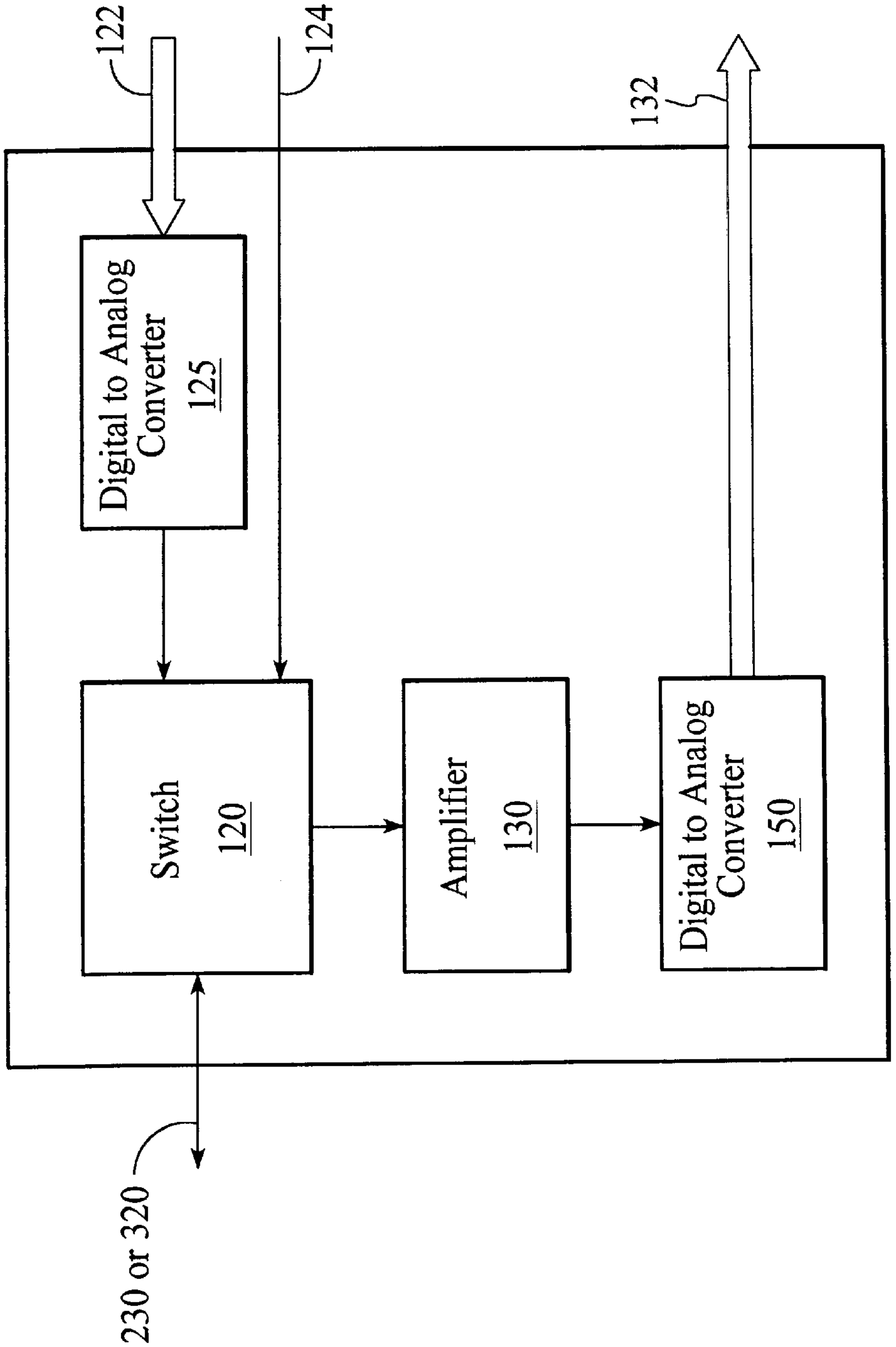
Figure 24B:
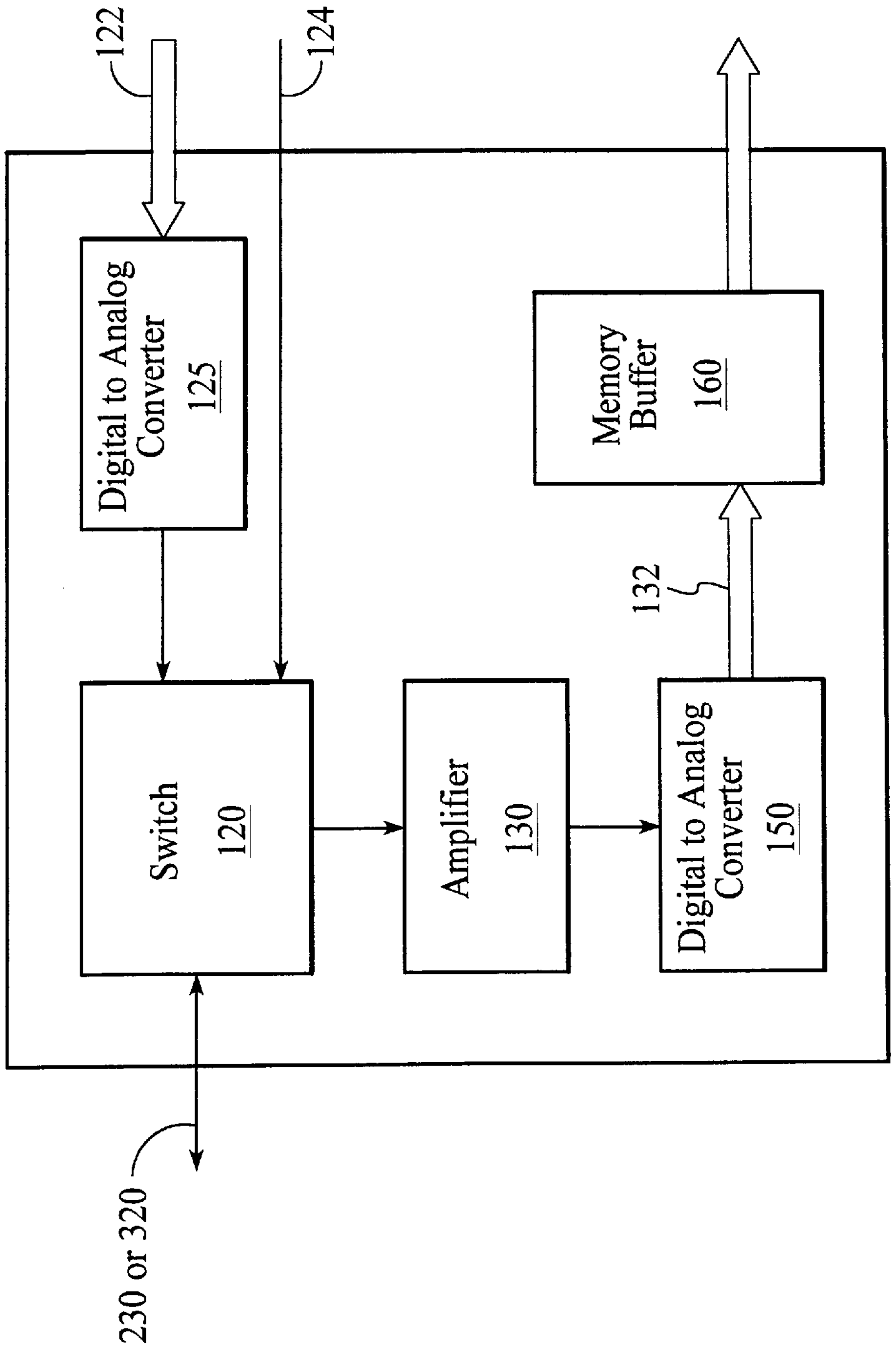

FIG. 23 illustrates a top view of a portion of an integrated circuit chip according to another embodiment of the present invention. In the embodiment of FIG. 23, each of the transducers 100 have disposed below it a switch 120, a digital to analog converter 125, an amplifier 130, and an analog to digital converter 150, of the type that has been previously discussed. Upon output of the digitized signals from the analog to digital converter 150, however, the present invention contemplates different configurations, two of which are shown in FIGS. 24A and 24B. Others, such as those using both electrodes and switching both electrodes have been previously discussed, or will become apparent. In the configuration illustrated in FIG. 24A, the digitized signals are passed along line 132 in serial (or lines 132 in parallel) to a memory buffer 160 or a digital multiplexor 170. In the configuration illustrated in FIG. 24B, the digitized signals are pass along line 132 in serial (or lines 132 in parallel) to a local memory buffer 180 disposed below the transducer 100. From the local memory buffer 180, the digitized signals are then transmitted to the memory buffer 160 or the digital multiplexor 170. The digital multiplexor is the digital equivalent of the analog multiplexor previously described. The memory buffer 160 operates to temporarily store the digitized data, so that data does not get lost due to differences in the rate and times that data is received and the rate and times that data is output off-chip. The memory buffer operates to temporarily store the digitized data, so that data does not get lost if the memory buffer 160 or the digital multiplexor 170 is not yet ready to receive it.

In addition to the circuit combinations discussed, the present invention also contemplates providing a flat surface for the transducers 100, as well as the etching of trenches between transducers 100 or the formation of walls between transducers, such that acoustic coupling does not occur between transducers 100 through the substrate or the ambient medium. Thus, the mechanical preparation of the integrated circuit substrate may require fabrication of such walls or trenches using conventional fabrication techniques.

While the present invention has been described herein with reference to particular embodiments thereof, a latitude of modification, various changes and substitutions are intended in the foregoing disclosure. For example, while a specific process was described for the formation of the transducers 100, such transducers 100 can be formed in other manners. Accordingly, it will be appreciated that in some instances some features of the invention will be employed without a corresponding use of other features without departing from the spirit and scope of the invention as set forth in the appended claims.

I claim:

1. A method of making an integrated circuit chip having an array of transducers and other circuit components comprising the steps of:

forming the other circuit components on a semiconductor substrate using a fabrication process, the fabrication process using materials that may cause malfunction if subjected to temperatures over a predetermined maximum temperature for a period of time, said step of forming including forming interconnect points to which transducer interconnect lines can be subsequently connected; and forming the array of transducers over the other circuit components, the step of forming the array of transducers using another fabrication process that will prevent the previously formed other circuit components from being subjected to temperatures over the predetermined maximum temperature for the period of time, the step of forming the array of transducers including forming transducer interconnect lines that couple at least one electrode associated with each transducer to the interconnect points.

2. A method according to claim 1 wherein the fabrication process is a CMOS fabrication process.

3. A method according to claim 1 wherein the fabrication process is a bipolar fabrication process.

4. A method according to claim 1 wherein the other fabrication process uses aluminum to establish the electrodes and the transducer interconnect lines.

5. A method according to claim 1 wherein the other circuit components include switches and amplifiers.

6. A method according to claim 1 wherein the other circuit components include switches, amplifiers and multiplexors.

7. A method according to claim 1, wherein, after the step of forming the other circuit components and before the step of forming the array of transducers, is included the step of planarizing an insulative surface of the semiconductor.

8. A method according to claim 1 wherein a vertical dimension of the interconnect lines is not greater than 5 times the horizontal dimension of the interconnect lines.

9. A method of making an integrated circuit chip having a transducer and another circuit component comprising the steps of:

forming the other circuit component on a semiconductor substrate using a fabrication process, the fabrication process using materials that may cause malfunction if subjected to temperatures over a predetermined maximum temperature for a period of time, said step of forming including forming at least one interconnect point to which at least one transducer interconnect line can be subsequently connected; and forming the transducer over the other circuit component, the step of forming the array of transducers using another fabrication process that will prevent the previously formed other circuit components from being subjected to temperatures over the predetermined maximum temperature for the period of time, the step of forming the transducer including forming at least one transducer interconnect line that couples to the at least one electrode associated with the transducer to the at least one interconnect point.

10. A method according to claim 9 wherein the fabrication process is a CMOS fabrication process.

11. A method according to claim 9 wherein the fabrication process is a bipolar fabrication process.

12. A method according to claim 9 wherein the other fabrication process uses aluminum to establish the electrodes and the transducer interconnect line.

13. A method according to claim 9 wherein the other circuit component includes a switch and an amplifier.

14. A method according to claim 9, wherein, after the step of forming the other circuit component and before the step of forming the transducer, is included the step of planarizing an insulative surface of the semiconductor.

* * * * *